(12) United States Patent
Okutani

(10) Patent No.: US 12,046,465 B2
(45) Date of Patent: *Jul. 23, 2024

(54) SUBSTRATE TREATMENT METHOD AND SUBSTRATE TREATMENT APPARATUS

(71) Applicant: SCREEN HOLDINGS CO., LTD., Kyoto (JP)

(72) Inventor: Manabu Okutani, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 156 days.

This patent is subject to a terminal disclaimer.

(21) Appl. No.: 17/674,552

(22) Filed: Feb. 17, 2022

(65) Prior Publication Data

US 2022/0172942 A1 Jun. 2, 2022

Related U.S. Application Data

(60) Continuation of application No. 15/674,262, filed on Aug. 10, 2017, now Pat. No. 11,289,324, which is a (Continued)

(30) Foreign Application Priority Data

Nov. 8, 2012 (JP) ................................. 2012-246546
Sep. 27, 2013 (JP) ................................. 2013-202711

(51) Int. Cl.
*H01L 21/02* (2006.01)
*B08B 3/04* (2006.01)
(Continued)

(52) U.S. Cl.
CPC ............ *H01L 21/0206* (2013.01); *B08B 3/04* (2013.01); *H01L 21/02068* (2013.01);
(Continued)

(58) Field of Classification Search
None
See application file for complete search history.

(56) References Cited

U.S. PATENT DOCUMENTS 5,817,156 A 10/1998 Tateyama et al.
5,882,433 A 3/1999 Ueno
(Continued)

FOREIGN PATENT DOCUMENTS

JP H9-293702 A 11/1997
JP 2006-295194 A 10/2006
(Continued)

OTHER PUBLICATIONS

English Machine Translation of JP2008-128567A (submitted on IDS filed Feb. 17, 2022).*

(Continued)

*Primary Examiner* — Natasha N Campbell
(74) *Attorney, Agent, or Firm* — Rimon P.C.

(57) ABSTRACT

The inventive substrate treatment method includes: an organic solvent supplying step of supplying an organic solvent having a smaller surface tension than a rinse liquid to the upper surface of a substrate so that rinse liquid adhering to the upper surface of the substrate is replaced with the organic solvent; a higher temperature maintaining step of maintaining the upper surface of the substrate at a predetermined temperature higher than the boiling point of the organic solvent to thereby form a gas film of the organic solvent on the entire upper surface of the substrate including the gap of the minute pattern and to form a liquid film of the organic solvent on the gas film, the higher temperature maintaining step being performed after the organic solvent supplying step is started; and an organic solvent removing step of removing the organic solvent liquid film from the upper surface of the substrate.

15 Claims, 17 Drawing Sheets

Related U.S. Application Data division of application No. 14/075,623, filed on Nov. 8, 2013, now Pat. No. 9,768,011.

(51) Int. Cl.
  *H01L 21/67* (2006.01)
  *H01L 21/687* (2006.01)

(52) U.S. Cl.
  CPC .... *H01L 21/67051* (2013.01); *H01L 21/6708* (2013.01); *H01L 21/67109* (2013.01); *H01L 21/67115* (2013.01); *H01L 21/68792* (2013.01)

(56) References Cited

U.S. PATENT DOCUMENTS

| | | |
|---|---|---|
| 6,793,769 B2 | 9/2004 | Kajino et al. |
| 6,857,388 B2 | 2/2005 | Lee et al. |
| 8,277,569 B2 | 10/2012 | Araki et al. |
| 9,768,011 B2 | 9/2017 | Okutani |
| 2002/0017363 A1 | 2/2002 | Nakashima et al. |
| 2002/0096196 A1 | 7/2002 | Toshima et al. |
| 2003/0092282 A1 | 5/2003 | Kim |
| 2006/0231125 A1 | 10/2006 | Yi |
| 2008/0006302 A1 | 1/2008 | Araki et al. |
| 2008/0078426 A1 | 4/2008 | Miya et al. |
| 2011/0155177 A1 | 6/2011 | Tamura et al. |
| 2012/0118332 A1 | 5/2012 | Sato et al. |
| 2012/0160274 A1 | 6/2012 | Kasai et al. |
| 2013/0233356 A1 | 9/2013 | Obweger et al. |
| 2013/0333722 A1 | 12/2013 | Tanaka |
| 2014/0127908 A1 | 5/2014 | Okutani |
| 2016/0025409 A1 | 1/2016 | Miyazaki et al. |
| 2017/0338097 A1 | 11/2017 | Okutani |
| 2018/0087836 A1 | 3/2018 | Yoshihara et al. |
| 2018/0272376 A1 | 9/2018 | Abe et al. |
| 2019/0237322 A1 | 8/2019 | Okutani et al. |

FOREIGN PATENT DOCUMENTS

| | | |
|---|---|---|
| JP | 2008-16660 A | 1/2008 |
| JP | 2008-128567 A | 6/2008 |
| JP | 2010-129809 A | 6/2010 |
| JP | 2010-238918 A | 10/2010 |
| JP | 2012-109301 A | 6/2012 |
| JP | 2012-138510 A | 7/2012 |
| JP | 2015-29041 A | 2/2015 |
| JP | 6131162 B2 | 5/2017 |
| KR | 10-0900126 B1 | 6/2009 |
| KR | 2011-0028532 A | 3/2011 |
| KR | 10-2011-0131707 A | 12/2011 |
| WO | 2012/056343 A2 | 5/2012 |
| WO | 2013/145371 A1 | 3/2013 |

OTHER PUBLICATIONS

U.S. PTO Non-Final Office Action issued in related parent U.S. Appl. No. 15/674,262, dated May 13, 2021.
U.S. PTO Final Office Action issued in related parent U.S. Appl. No. 15/674,262, dated Feb. 1, 2021.
U.S. PTO Non-Final Office Action issued in related parent U.S. Appl. No. 15/674,262, dated Jul. 21, 2020.
U.S. PTO Non-Final Office Action issued in related parent U.S. Appl. No. 15/674,262, dated Sep. 26, 2019.
U.S. PTO Notice of Allowance issued in related parent U.S. Appl. No. 15/674,262, dated Nov. 23, 2021.
Decision to Grant a Patent issued Mar. 16, 2017, in corresponding Japanese Patent Application No. 2013-202711.
Non-Final Office Action issued Jun. 22, 2016, in U.S. Appl. No. 14/075,623.
Final Office Action issued Nov. 28, 2016, in U.S. Appl. No. 14/075,623.
Notice of Allowance issued May 10, 2017, in U.S. Appl. No. 14/075,623.

\* cited by examiner

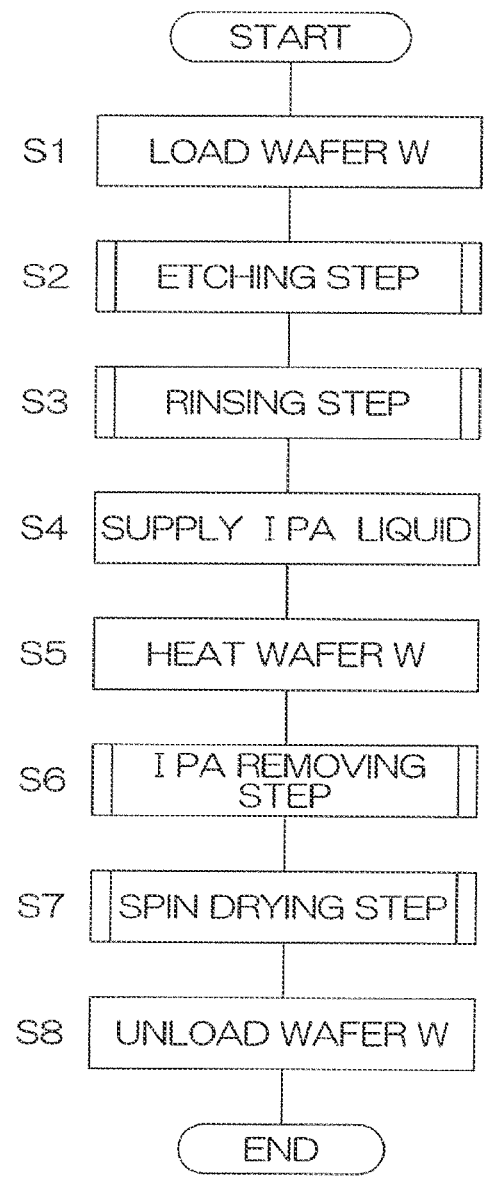

SUBSTRATE TREATMENT METHOD AND SUBSTRATE TREATMENT APPARATUS

RELATED APPLICATIONS

This application is a Continuation of U.S. patent application Ser. No. 15/674,262, filed on Aug. 10, 2017, which is a Divisional of U.S. patent application Ser. No. 14/075,623, filed on Nov. 8, 2013, now U.S. Pat. No. 9,768,011, issued on Sep. 19, 2017, which in turn claims the benefit of Japanese Application No. 2013-202711, filed on Sep. 27, 2013 and Japanese Application No. 2012-246546, filed on Nov. 8, 2012, the entire disclosures of each are incorporated by reference in their entirety.

BACKGROUND OF THE INVENTION

1. Field of the Invention

The present invention relates to a substrate treatment method and a substrate treatment apparatus for treating a substrate such as a semiconductor wafer.

2. Description of Related Art

In a semiconductor device production process, a treatment liquid is supplied to a front surface of a substrate such as a semiconductor wafer to treat the front surface of the substrate with the treatment liquid.

A substrate treatment apparatus of a single substrate treatment type adapted to treat a single substrate at a time, for example, includes a spin chuck which generally horizontally holds the substrate and rotates the substrate, and a nozzle which supplies a treatment liquid to a front surface of the substrate rotated by the spin chuck. A chemical liquid is supplied to the substrate held by the spin chuck, and then pure water is supplied to the substrate, whereby the chemical liquid on the substrate is replaced with the pure water. Thereafter, a spin drying step is performed to remove the pure water from the substrate. In the spin drying step, the substrate is rotated at a higher rotation speed, so that pure water adhering to the substrate is spun off (dried). In this drying method, however, pure water entering gaps of a pattern formed on the front surface of the substrate is not properly spun off, but is liable to remain in the gaps of the pattern.

To cope with this, a substrate drying method is proposed in which, after the substrate is rinsed with the pure water, a normal-temperature organic solvent such as isopropyl alcohol (IPA) is supplied to the front surface of the substrate and the pure water entering the gaps of the minute pattern on the front surface of the substrate is replaced with the organic solvent for drying the front surface of the substrate (see, for example, U.S. Pat. No. 5,882,433A).

SUMMARY OF THE INVENTION

In the spin drying step, adjacent pattern portions of the pattern are often attracted into contact with each other, resulting in collapse of the pattern. One cause of this problem is supposedly the surface tension of the liquid present between the adjacent pattern portions. Where the organic solvent is supplied to the substrate before the spin drying step, the organic solvent is present between the pattern portions. Since the organic solvent has a smaller surface tension, it is considered that an attractive force between the adjacent pattern portions is reduced, thereby preventing the collapse of the pattern.

In recent years, however, a minute pattern of a higher aspect ratio (projection pattern, linear pattern or the like) is formed on the front surface of the semiconductor substrate for higher integration. Since the minute pattern of the higher aspect ratio is more liable to collapse, it is often difficult to sufficiently suppress the collapse of the pattern in the spin drying step simply by supplying the organic solvent to the front surface of the substrate to clean the substrate before the spin drying step.

It is therefore an object of the present invention to provide a substrate treatment method and a substrate treatment apparatus which, even where a substrate having an upper surface formed with a minute pattern of a higher aspect ratio is cleaned, make it possible to properly dry the upper surface of the substrate while substantially preventing the collapse of the pattern.

According to the present invention, there is provided a substrate treatment method, which includes: a rinsing step of supplying a rinse liquid to an upper surface of a substrate formed with a minute pattern, the substrate being horizontally held by a substrate holding unit; an organic solvent supplying step of supplying an organic solvent having a smaller surface tension than the rinse liquid to the upper surface of the substrate held by the substrate holding unit to form a liquid film of the organic solvent on the upper surface so that rinse liquid adhering to the upper surface of the substrate including a gap of the minute pattern is replaced with the organic solvent; a higher temperature maintaining step of maintaining the upper surface of the substrate held by the substrate holding unit at a predetermined temperature higher than the boiling point of the organic solvent to thereby form a gas film of the organic solvent on the entire upper surface of the substrate including the gap of the minute pattern and to form the liquid film of the organic solvent on the gas film, the higher temperature maintaining step being performed after the organic solvent supplying step is started; and an organic solvent removing step of removing the organic solvent from the upper surface of the substrate held by the substrate holding unit.

In this method, the rinse liquid present in the gap of the minute pattern is replaced with the organic solvent by supplying the organic solvent to the upper surface of the substrate, whereby the rinse liquid is properly removed from the upper surface of the substrate.

After the supply of the organic solvent to the upper surface of the substrate is started, the upper surface of the substrate is maintained at the predetermined temperature higher than the boiling point of the organic solvent. Thus, the organic solvent gas film is formed on the minute pattern and in the gap of the minute pattern, and the organic solvent liquid film is formed on the organic solvent gas film. In this state, the organic solvent has a smaller surface tension in the gap of the minute pattern, so that the collapse of the pattern is less liable to occur due to the surface tension. Therefore, even when a substrate formed with a minute pattern of a higher aspect ratio is cleaned, it is possible to properly dry the upper surface of the substrate while substantially preventing the collapse of the pattern.

According to an embodiment of the present invention, the organic solvent removing step is started before the higher temperature maintaining step ends.

In the higher temperature maintaining step, the organic solvent liquid film is separated upward from the upper surface of the substrate via the organic solvent gas film. Therefore, substantially no frictional force acts between the organic solvent liquid film and the upper surface of the substrate, so that the organic solvent liquid film is easily moved along the upper surface of the substrate.

Since the organic solvent removing step is started before the end of the higher temperature maintaining step, the organic solvent liquid film can be moved along the upper surface of the substrate to be relatively easily removed from the upper surface of the substrate. Thus, the organic solvent liquid film can be properly removed from the upper surface of the substrate without the collapse of the pattern.

The temperature of the substrate in the higher temperature maintaining step is preferably set such that the organic solvent is prevented from boiling in the higher temperature maintaining step. This effectively prevents the organic solvent liquid film from being cleaved.

The predetermined higher temperature may be higher by 10° C. to 50° C. than the boiling point of the organic solvent.

At least one of the substrate temperature in the higher temperature maintaining step and a duration of the higher temperature maintaining step may be set such that a gas-phase organic solvent of the organic solvent gas film is prevented from cleaving through the organic solvent liquid film to above the liquid film.

The thickness of the organic solvent liquid film in the higher temperature maintaining step may be set such that the organic solvent liquid film is prevented from being split in the higher temperature maintaining step. This effectively prevents the cleavage of the organic solvent liquid film. More specifically, the thickness of the organic solvent liquid film in the higher temperature maintaining step may be set to 1 to 5 mm at the center of the substrate. In this case, the cleavage of the organic solvent liquid film can be more effectively prevented.

The higher temperature maintaining step is the step of, while rotating the substrate held by the substrate holding unit, maintaining the upper surface of the substrate at the predetermined higher temperature. The rotation speed of the substrate in the higher temperature maintaining step may be set to 10 to 500 rpm. In this case, the cleavage of the organic solvent liquid film can be effectively prevented.

In the higher temperature maintaining step, the organic solvent may be additionally supplied to the organic solvent liquid film. In this case, the cleavage of the organic solvent liquid film can be effectively prevented.

According to another embodiment of the present invention, the organic solvent supplying step is performed when the temperature of the upper surface of the substrate held by the substrate holding unit is lower than the boiling point of the organic solvent.

In this method, the organic solvent is supplied in a liquid phase onto the upper surface of the substrate, and then the liquid-phase organic solvent enters the gap of the minute pattern. Since the organic solvent is in the liquid phase, the rinse liquid present in the gap of the minute pattern can be properly replaced with the organic solvent. Thus, the rinse liquid can be reliably removed from the upper surface of the substrate.

Then, the gap of the minute pattern is filled with the gas-phase organic solvent in the higher temperature maintaining step performed after the start of the organic solvent supplying step. Thus, even when a substrate formed with a minute pattern of a higher aspect ratio is cleaned, it is possible to properly dry the upper surface of the substrate while substantially preventing the collapse of the pattern.

In the substrate treatment method, the higher temperature maintaining step may include the step of heating the substrate held by the substrate holding unit by a heater disposed below the substrate.

According to further another embodiment of the present invention, the substrate treatment method further includes a spin drying step of rotating the substrate held by the substrate holding unit to dry the substrate after the organic solvent removing step.

In this method, the organic solvent is removed from the upper surface of the substrate before the spin drying step. Since the spin drying step is performed in the absence of the organic solvent on the upper surface of the substrate, the collapse of the pattern can be reliably prevented in the spin drying step.

The organic solvent removing step may include the step of spouting a gas toward the rotation center of the upper surface of the substrate held by the substrate holding unit while rotating the substrate.

The organic solvent removing step may include the step of spraying a gas in the form of zone stream toward the upper surface of the substrate held by the substrate holding unit while moving a gas applying zone over the upper surface of the substrate.

The organic solvent removing step may include the step of tilting the substrate held by the substrate holding unit with respect to a horizontal plane.

The organic solvent removing step may include the step of heating the substrate held by the substrate holding unit sequentially from a center portion of the substrate to a peripheral portion of the substrate.

According to the present invention, there is also provided a substrate treatment apparatus which includes: a substrate holding unit which horizontally holds a substrate having an upper surface formed with a minute pattern; an organic solvent supplying unit which supplies a predetermined organic solvent having a smaller surface tension than water to the upper surface of the substrate held by the substrate holding unit; a heater disposed below the substrate held by the substrate holding unit to heat the substrate; an organic solvent supply controlling unit which controls the organic solvent supplying unit to supply the organic solvent to the upper surface of the substrate held by the substrate holding unit; a higher temperature maintenance controlling unit which controls the heater to maintain the substrate held by the substrate holding unit at a predetermined temperature higher than the boiling point of the organic solvent whereby a gas film of the organic solvent is formed on the entire upper surface of the substrate including a gap of the minute pattern and a liquid film of the organic solvent is formed on the gas film; and an organic solvent removal controlling unit which removes the organic solvent from the upper surface of the substrate held by the substrate holding unit.

With this arrangement, the organic solvent is supplied to the upper surface of the substrate, whereby the rinse liquid present in the gap of the minute pattern is replaced with the organic solvent. Thus, the rinse liquid is properly removed from the upper surface of the substrate.

Then, the upper surface of the substrate is maintained at the predetermined temperature higher than the boiling point of the organic solvent, whereby the organic solvent gas film is formed on the minute pattern and in the gap of the minute pattern and the organic solvent liquid film is formed on the organic solvent gas film. In this state, the surface tension in the gap of the minute pattern is reduced, so that the collapse of the pattern is less liable to occur due to the surface tension. Thus, even when a substrate formed with a minute pattern of a higher aspect ratio is cleaned, it is possible to properly dry the upper surface of the substrate while substantially preventing the collapse of the pattern.

According to one embodiment of the present invention, the substrate treatment apparatus further includes an enclosure cup which includes a cup body having an opening, and a lid member closing the opening, the enclosure cup having an internal space isolated from an outer side. The substrate holding unit is accommodated in the internal space.

With this arrangement, the substrate holding unit is accommodated in the internal space of the enclosure cup. Since the organic solvent is handled in a higher temperature environment, there is a possibility that a violent reaction occurs on the substrate. However, the violent reaction is confined in the enclosure cup, because the substrate is accommodated together with the substrate holding unit in the internal space of the enclosure cup. This prevents a damage to a portion of the substrate treatment apparatus present outside the enclosure cup.

The heater may be spaced downward from the substrate held by the substrate holding unit to heat the substrate. The substrate treatment apparatus may further include a lift unit which moves up and down at least one of the heater and the substrate holding unit so that the heater and the substrate held by the substrate holding unit are moved toward and away from each other.

With this arrangement, the distance between the heater and the substrate held by the substrate holding unit can be changed. Where the heater and the substrate are spaced a smaller distance from each other, the substrate is heated to a higher temperature by the heater. Where the distance between the heater and the substrate is significantly increased from this state, the amount of heat to be applied to the substrate is reduced and, therefore, the substrate can be cooled immediately.

The foregoing and other objects, features and effects of the present invention will become more apparent from the following detailed description of the preferred embodiments with reference to the attached drawings.

BRIEF DESCRIPTION OF THE DRAWINGS

FIG. 6 is a process diagram for explaining an exemplary etching process to be performed by the substrate treatment apparatus shown in FIG. 1.

DETAILED DESCRIPTION OF PREFERRED EMBODIMENTS

Figure 1:
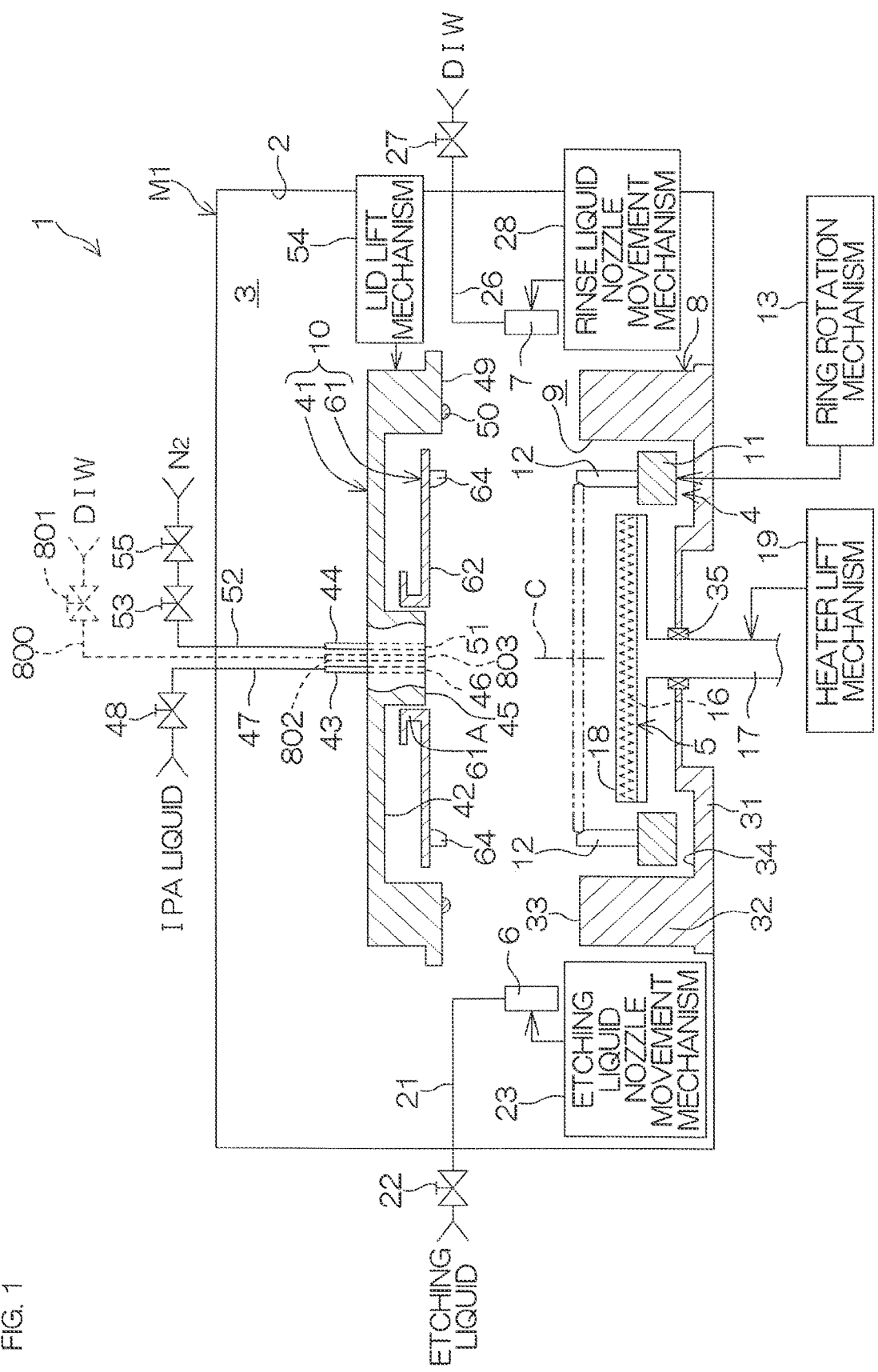
FIG. 1 is a sectional view schematically showing the construction of a substrate treatment apparatus according to a first embodiment of the present invention.

FIG. 1 is a sectional view schematically showing the construction of a substrate treatment apparatus 1 according to a first embodiment of the present invention.

The substrate treatment apparatus 1 is of a single substrate treatment type which is adapted to perform an etching process (exemplary cleaning process) on a front surface of a round semiconductor wafer W (hereinafter referred simply as "wafer W") having a device formation region. Where the substrate treatment apparatus 1 is to perform the etching process for removing a natural oxide film, a dilute hydrofluoric acid solution is used as an etching liquid. Where the substrate treatment apparatus 1 is to perform an etching process for removing a sacrificial film, a concentrated hydrofluoric acid solution, TMAH (tetramethylammonium hydroxide) or the like is used as an etching liquid.

The substrate treatment apparatus 1 includes a treatment module M1 for treating the wafer W. The treatment module M1 includes a treatment chamber 3 defined by a partition wall 2, a substrate holding/rotating mechanism (substrate holding unit) 4 which horizontally holds and rotates the wafer W, a heater 5 disposed in opposed relation to a lower surface of the wafer W held by the substrate holding/rotating mechanism 4 to heat the wafer W from below, an etching liquid nozzle 6 which spouts an etching liquid to the front surface (upper surface) of the wafer W held by the substrate holding/rotating mechanism 4, a rinse liquid nozzle 7 which spouts DIW (deionized water) as a rinse liquid to the front surface of the wafer W held by the substrate holding/rotating mechanism 4, a lower cup (cup body) 8 in which the substrate holding/rotating mechanism 4 is accommodated, and a lid member 10 which closes an opening 9 of the lower cup 8. The substrate holding/rotating mechanism 4, the heater 5, the etching liquid nozzle 6, the rinse liquid nozzle 7, the lower cup 8 and the lid member 10 are accommodated in the treatment chamber 3. With the opening 9 of the lower cup 8 closed with the lid member 10, an enclosure cup having an enclosed internal space is provided.

The substrate holding/rotating mechanism 4 includes an annular planar rotation ring 11 having a rotation center concentric with a rotation axis (vertical axis) C of the wafer W and supported horizontally, and a plurality of lower abutment pins (e.g., six lower abutment pins) 12 disposed vertically upright on an upper surface of the rotation ring 11. The lower abutment pins 12 each have a cylindrical shape, and support the wafer W from below. A ring rotation mechanism 13 which rotates the rotation ring 11 about the rotation axis C is connected to the rotation ring 11. The ring rotation mechanism 13 includes, for example, a motor and a transmission mechanism associated with the motor.

The heater 5 is a resistance heater, which includes a main body such as made of a ceramic material or silicon carbide (SiC) and a resistor 16 embedded in the main body. The heater 5 is supported by a heater support base 17.

The heater 5 is of a disk shape, and has a horizontal flat round upper surface 18. The upper surface 18 of the heater 5 is opposed to a portion (except for a peripheral portion) of the lower surface of the wafer W held by the substrate holding/rotating mechanism 4. When the resistor 16 is energized to generate heat, the entire heater 5 including the upper surface 18 is heated. The amount of heat to be generated per unit area by the energized heater 5 is uniform over the entire upper surface 18 of the heater 5.

The heater 5 is nonrotatable, thereby obviating the need for providing a rotatable electrical contact for the energization of the resistor 16. Therefore, the amount of power to be supplied to the heater 5 is not restricted as compared with a case in which the heater 5 is rotatable. Thus, the wafer W can be heated up to a desired higher temperature.

Figure 7A:
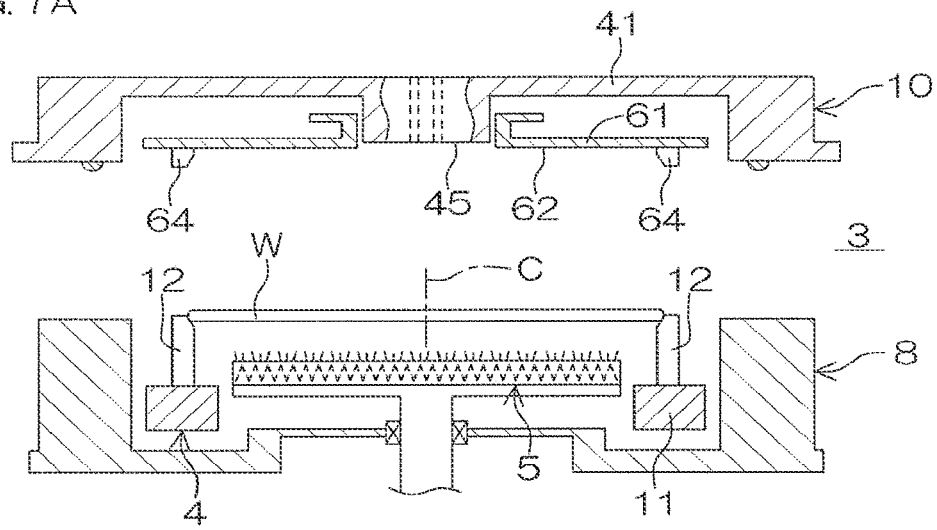
FIGS. 7A to 7I are schematic diagrams for explaining the exemplary process of FIG. 6.

A heater lift mechanism (lift unit) 19 which moves up and down the heater 5 together with the heater support base 17 is connected to the heater support base 17. The heater 5 is moved up and down in a horizontal attitude by the heater lift mechanism 19. The heater lift mechanism 19 includes, for example, a ball screw and a motor. By driving the heater lift mechanism 19, the heater 5 is moved up and down between a lower position (away position as shown in FIG. 7A and the like) at which the upper surface 18 thereof is spaced downward away from the lower surface of the wafer W and an upper position (adjacent position as shown in FIG. 7F and the like) at which the upper surface 18 thereof is opposed to and spaced a minute distance W1 from the lower surface of the wafer W. Thus, the amount of heat to be applied to the wafer W by the heater 5 is controlled by changing the distance between the heater 5 and the lower surface of the wafer W.

The etching liquid nozzle 6 is, for example, a straight nozzle which spouts the etching liquid downward in the form of continuous stream. An etching liquid supply pipe 21 serving as an etching liquid supply passage for supplying the etching liquid from an etching liquid supply source is connected to the etching liquid nozzle 6. An etching liquid valve 22 which is opened and closed to turn on and off the supply of the etching liquid is provided in the etching liquid supply pipe 21. With the etching liquid valve 22 open, the etching liquid is supplied to the etching liquid nozzle 6 from the etching liquid supply pipe 21. With the etching liquid valve 22 closed, the supply of the etching liquid to the etching liquid nozzle 6 from the etching liquid supply pipe 21 is stopped. An etching liquid nozzle movement mechanism 23 is connected to the etching liquid nozzle 6. The etching liquid nozzle movement mechanism 23 moves the etching liquid nozzle 6 between a position above the substrate holding/rotating mechanism 4 and a home position defined on a lateral side of the substrate holding/rotating mechanism 4 (outward of the lower cup 8).

The rinse liquid nozzle 7 is, for example, a straight nozzle which spouts the rinse liquid downward in the form of continuous stream. A rinse liquid supply pipe 26 serving as a DIW supply passage for supplying the DIW from a DIW supply source is connected to the rinse liquid nozzle 7. A rinse liquid valve 27 which is opened and closed to turn on and off the supply of the rinse liquid is provided in the rinse liquid supply pipe 26. With the rinse liquid valve 27 open, the DIW is supplied to the rinse liquid nozzle 7 from the rinse liquid supply pipe 26. With the rinse liquid valve 27 closed, the supply of the DIW to the rinse liquid nozzle 7 from the rinse liquid supply pipe 26 is stopped. A rinse liquid nozzle movement mechanism 28 is connected to the rinse liquid nozzle 7. The rinse liquid nozzle movement mechanism 28 moves the rinse liquid nozzle 7 between the position above the substrate holding/rotating mechanism 4 and a home position defined on a lateral side of the substrate holding/rotating mechanism 4 (outward of the lower cup 8).

The lower cup 8 is of a generally cylindrical container-like shape, and has a round opening 9 provided on an upper side. The lower cup 8 unitarily includes a generally disk-shaped bottom wall 31, and a peripheral wall 32 extending upright from the bottom wall 31. The peripheral wall 32 has a hollow cylindrical shape defined about the rotation axis C. The peripheral wall 32 has an annular upper end face 33. The bottom wall 31 has an annular groove 34 provided in an upper surface thereof below the rotation ring 11 for retaining the etching liquid, the rinsing liquid and an IPA liquid scattered from a peripheral edge of the wafer W. A waste liquid passage (not shown) is connected at its one end to the annular groove 34. The other end of the waste liquid passage is connected to an external waste liquid facility (not shown).

A cup (not shown) for capturing the etching liquid scattered from the wafer W held on the lower abutment pins 12 is provided around the peripheral wall 32. A bottom portion of the cup is connected to the external waste liquid facility (not shown).

The heater support base 17 extends downward through a center portion of the bottom wall 31. A gap defined between a shaft of the heater support base 17 and the center portion of the bottom wall 31 is sealed with an annular seal member 35.

The lid member 10 is disposed in a generally horizontal attitude above the substrate holding/rotating mechanism 4. The lid member 10 has a double lid structure including a generally disk-shaped outer lid 41 and a generally disk-shaped inner lid 61 which are stacked one on the other. The outer lid 41 has an upper annular groove 42 provided in a portion of a lower surface thereof between a center portion and a peripheral portion thereof and having a cylindrical shape coaxial with the outer lid 41. The inner lid 61 is accommodated in the upper annular groove 42 and held rotatably with respect to the outer lid 41.

The outer lid 41 is disposed in a generally horizontal attitude with its center located on the rotation axis C of the wafer W. An organic solvent flow pipe (organic solvent supply unit) 43 and a nitrogen gas flow pipe 44 are inserted and vertically extend in adjacent relation through the center portion of the outer lid 41.

The center portion of the outer lid 41 has a horizontal flat round lower surface 45. The center portion lower surface 45 is opposed to the center portion of the front surface (upper surface) of the wafer W held by the substrate holding/rotating mechanism 4.

The organic solvent flow pipe 43 has a lower end which opens in the center portion lower surface 45 of the outer lid 41 to serve as an organic solvent outlet port 46. An organic solvent supply pipe 47 is connected to the organic solvent flow pipe 43. Isopropyl alcohol (IPA) liquid as an example of an organic solvent having a smaller surface tension than DIW (water, rinse liquid) is supplied to the organic solvent supply pipe 47 from an IPA liquid supply source. An organic solvent valve 48 which is opened and closed to turn on and off the supply of the organic solvent is provided in the organic solvent supply pipe 47.

The nitrogen gas flow pipe 44 has a lower end which also opens in the center portion lower surface 45 of the outer lid 41 to serve as a nitrogen gas outlet port 51 through which nitrogen gas ($N_2$) is spouted as an example of an inert gas. A nitrogen gas supply pipe 52 serving as a nitrogen gas supply passage for supplying the nitrogen gas from a nitrogen gas supply source is connected to the nitrogen gas flow pipe 44. A nitrogen gas valve 53 which is opened and closed to turn on and off the supply of the nitrogen gas and a flow rate control valve 55 which controls the opening degree of the nitrogen gas supply pipe 52 to control the flow rate of the gas to be supplied from the nitrogen gas outlet port 51 are provided in the nitrogen gas supply pipe 52.

A seal ring 50 is provided on a radially intermediate portion of a peripheral portion lower surface 49 of the outer lid 41 circumferentially of the peripheral portion lower surface 49. The seal ring 50 is made of, for example, an elastic resin material.

The inner lid 61 has a generally disk shape surrounding the center portion lower surface 45 of the outer lid 41. The inner lid 61 has a slightly greater diameter than the wafer W, and is disposed in a generally horizontal attitude with its center located on the rotation axis C of the wafer W. A short inner cylindrical portion 61A is connected to an inner peripheral edge of the inner lid 61. The inner cylindrical portion 61A includes an extension portion extending vertically upward, and a horizontal annular portion projecting radially outward from an upper edge of the extension portion. The inner cylindrical portion 61A is connected to the center portion lower surface 45 of the outer lid 41 so as to be independently rotatable with respect to the center portion lower surface 45 of the outer lid 41.

The inner lid 61 has a lower surface serving as a substrate opposing surface 62 to be opposed to a portion of the upper surface of the wafer W held by the substrate holding/rotating mechanism 4 except for the center portion of the wafer W. The substrate opposing surface 62 is an annular horizontal flat surface surrounding the center portion lower surface 45 of the outer lid 41. Six upper abutment pins 64, for example, are equidistantly disposed on a peripheral portion of the substrate opposing surface 62. The upper abutment pins 64 each have a cylindrical shape extending vertically downward.

The inner lid 61 is rotatable together with the wafer W about a vertical axis extending through the center of the inner lid 61 (coinciding with the rotation axis C of the wafer W).

Further, a lid lift mechanism 54 which moves up and down the outer lid 41 and the inner lid 61 together is connected to the lid member 10. By driving the lid lift mechanism 54, the lid member 10 is moved up and down between an open position at which the opening 9 of the lower cup 8 is uncovered with the lid member 10 retracted above the lower cup 8 and a closed position at which the opening 9 of the lower cup 8 is closed.

With the lid member 10 located at the closed position, the seal ring 50 provided on the peripheral portion lower surface of the outer lid 41 abuts against the upper end face 33 of the lower cup 8 along the entire peripheral portion to seal a gap between the outer lid 41 and the lower cup 8. In this state, the substrate opposing surface 62 of the inner lid 61 and the center portion lower surface 45 of the outer lid 41 are spaced a minute distance W2 (e.g., about 4 mm, see FIG. 7D) from the upper surface of the wafer W so as to be disposed in adjacent opposed relation with respect to the upper surface of the wafer W.

Figure 2:
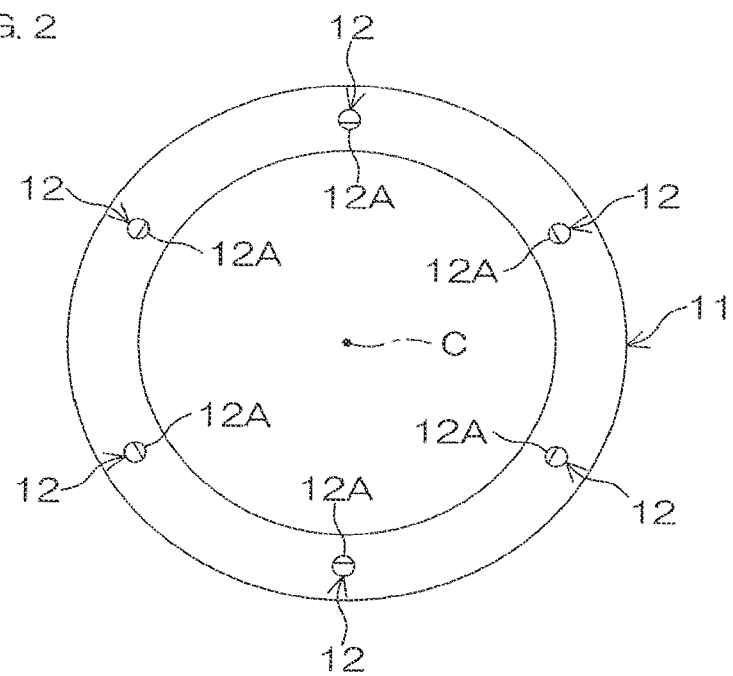
FIG. 2 is a plan view of a substrate holding/rotating mechanism shown in FIG. 1.

FIG. 2 is a plan view of the substrate holding/rotating mechanism 4.

The six lower abutment pins 12 are, for example, equidistantly disposed on the upper surface of the rotation ring 11 circularly about the rotation axis C of the wafer W (see FIG. 1). The lower abutment pins 12 each have an upper end portion which includes a horizontal surface and a lower abutment surface 12A inclined downward toward the rotation axis C. With the wafer W placed on the six lower abutment pins 12, the peripheral edge of the lower surface (back surface) of the wafer W abuts against the lower abutment surfaces 12A of the lower abutment pins 12, whereby the wafer W is properly held by the substrate holding/rotating mechanism 4 and rotated at a treatment rotation speed (e.g., 10 to 3000 rpm) in substrate treatment steps.

Figure 3:
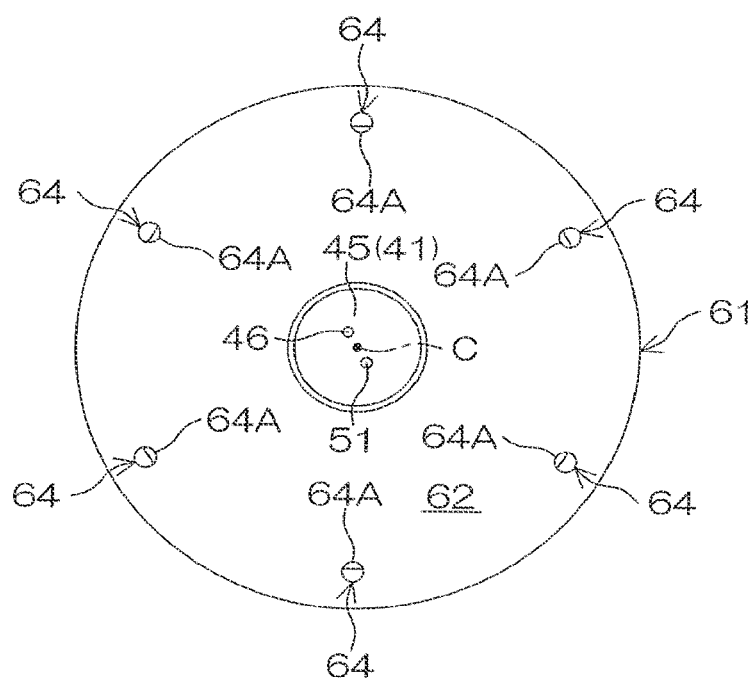
FIG. 3 is a bottom view of an inner lid shown in FIG. 1.

FIG. 3 is a bottom view of the inner lid 61. The six upper abutment pins 64 are, for example, equidistantly disposed on the substrate opposing surface 62 of the inner lid 61 circularly about the vertical axis extending through the center of the inner lid 61 (coinciding with the rotation axis C of the wafer W). The upper abutment pins 64 each have a lower end portion which includes a horizontal surface and an upper abutment surface 64A inclined upward toward the vertical axis extending through the center of the inner lid 61. A distance between each of the upper abutment pins 64 and the vertical axis extending through the center of the inner lid 61 is equal to a distance between each of the upper abutment pins 64 and the rotation axis C. The upper abutment surfaces 64A of the upper abutment pins 64 are capable of properly supporting the wafer W in abutment with the peripheral edge of the upper surface of the wafer W.

Figure 4A:
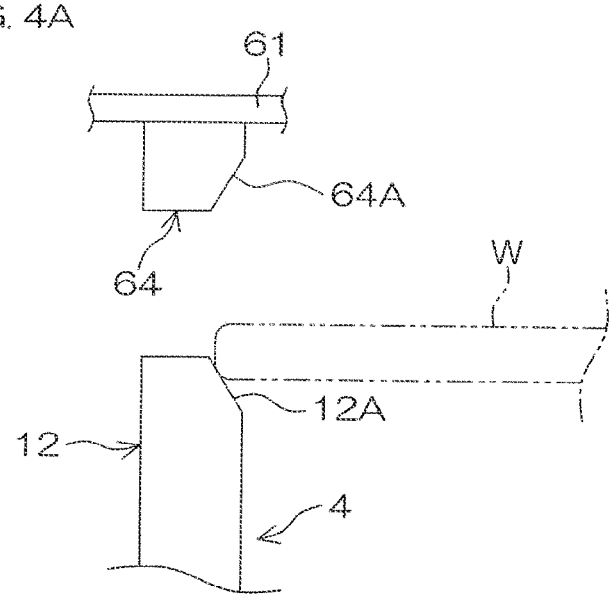
FIGS. 4A and 4B are diagrams for explaining how to support a wafer by upper and lower abutment pins shown in FIG. 1.
Figure 4B:
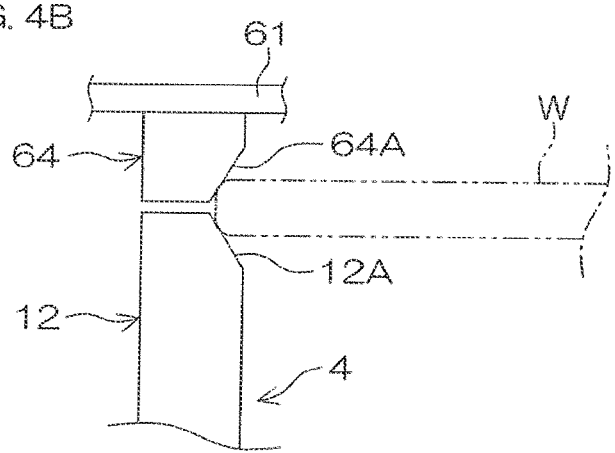

FIGS. 4A and 4B are diagrams for explaining how to support the wafer W by the lower abutment pins 12 and the upper abutment pins 64.

Where the substrate holding/rotating mechanism 4 and the inner lid 61 respectively assume their basic attitudes, as shown in FIGS. 1 to 4B, the circumferential positions of the six lower abutment pins 12 respectively coincide with the circumferential positions of the six upper abutment pins 64. That is, with the substrate holding/rotating mechanism 4 and the inner lid 61 respectively assuming their basic attitudes, the upper abutment pins 64 are respectively located vertically immediately above the lower abutment pins 12.

The lid lift mechanism 54 is driven to move down the lid member 10 to the closed position with the substrate holding/rotating mechanism 4 and the inner lid 61 assuming their basic attitudes and with the wafer W held by the substrate holding/rotating mechanism 4. Thus, the upper abutment pins 64 provided on the inner lid 61 abut against the upper surface peripheral portion of the wafer W held by the substrate holding/rotating mechanism 4 to press the upper surface peripheral portion of the wafer W against the corresponding lower abutment pins 12. The peripheral edge of the wafer W is held between the upper and lower abutment pins 64 and 12 form above and below. Thus, the wafer W is held by the plural pairs (six pairs) of upper and lower abutment pins 64, 12, whereby the wafer W is firmly held by the substrate holding/rotating mechanism 4 and the inner lid 61. The wafer W is rotated by synchronously rotating the rotation ring 11 of the substrate holding/rotating mechanism 4 and the inner lid 61 in the same direction. At this time, the substrate holding/rotating mechanism 4 and the inner lid 61 are capable of holding the wafer W and rotating the wafer W at a maximum rotation speed of 3000 rpm.

Figure 5:
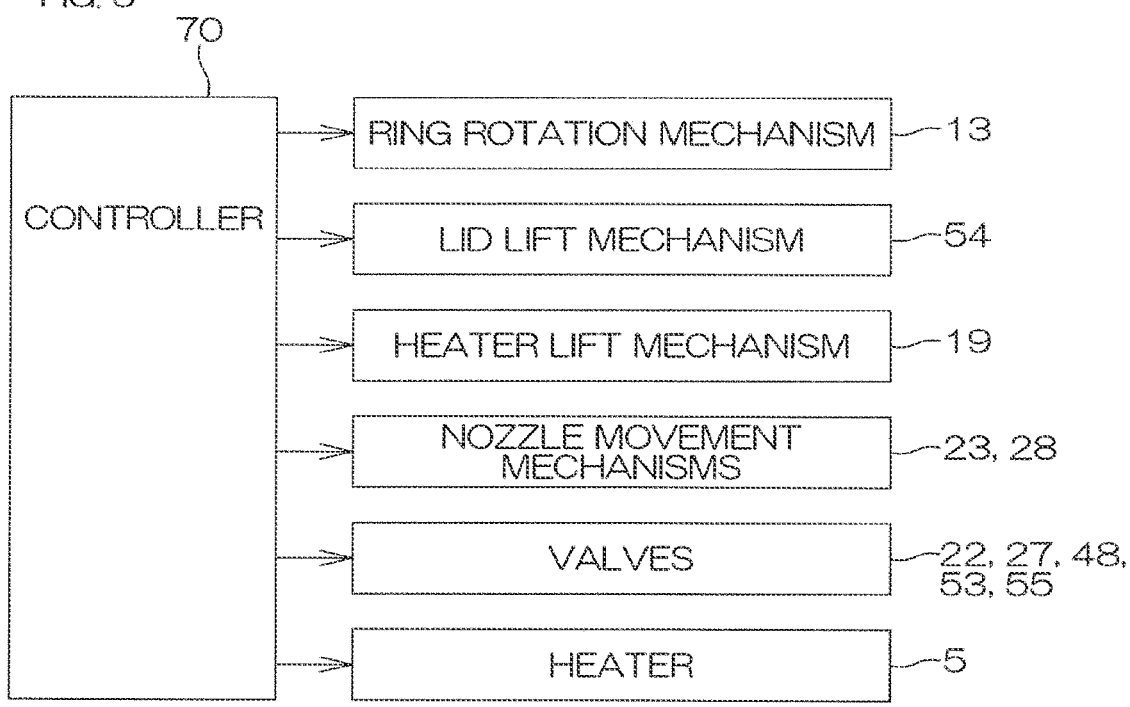
FIG. 5 is a block diagram showing the electrical construction of the substrate treatment apparatus shown in FIG. 1.

FIG. 5 is a block diagram showing the electrical construction of the substrate treatment apparatus 1.

The substrate treatment apparatus 1 includes a controller 70 including a microcomputer. The controller 70 controls the operations of the ring rotation mechanism 13, the lid lift mechanism 54, the heater lift mechanism 19, the etching liquid nozzle movement mechanism 23, the rinse liquid nozzle movement mechanism 28 and the like.

Further, the controller 70 controls the opening/closing operations of the etching liquid valve 22, the rinse liquid valve 27, the organic solvent valve 48 and the nitrogen gas valve 53, and controls the opening degree of the flow rate control valve 55. The controller 70 switches on and off the energization of the resistor 16 (see FIG. 1) to control the on/off operation of the heater 5.

FIG. 6 is a process diagram for explaining an exemplary etching process to be performed by the substrate treatment apparatus 1. FIGS. 7A to 7I are schematic diagrams for explaining this exemplary process step by step. FIGS. 8A to 8D are schematic sectional views for explaining the states of the upper surface of the wafer W in this exemplary process.

Referring to FIGS. 1 to 8D, the exemplary etching process will hereinafter be described.

In the etching process, a transport robot (not shown) is controlled to load an untreated wafer W into the treatment chamber 3 (Step S1).

As shown in FIGS. 8A to 8D, the wafer W to be loaded into the treatment chamber 3 is, for example, a silicon wafer having a front surface formed with a minute pattern 101. The minute pattern 101 includes projection structures 102 arranged as extending in the same direction. The structures 102 each have a line width W0 of about 10 nm to about 45 nm (see FIG. 8A), and the minute pattern 101 has a line pitch W3 of about 10 nm to several micrometers (see FIG. 8A). The minute pattern 101 may be a pattern including linear structures. In this case, the minute pattern 101 has trench-like gaps. Alternatively, the minute pattern 101 may be provided by forming a plurality of small voids (minute pores) in a predetermined thin film.

In general, the minute pattern 101 includes an insulation film. The minute pattern 101 may include a conductor film. More specifically, the minute pattern 101 may be formed of a multilayer film including a plurality of films stacked one on another, particularly including an insulation film and a conductor film. The minute pattern 101 may be a pattern of a single layer film. The insulation film may be an $SiO_2$ film or a nitride film. The conductor film may be an amorphous silicon film doped with an impurity for reduction of the resistance thereof or may be a metal film (e.g., metal interconnection film). Other examples of the films for the multilayer film include a polysilicon film, an SiN film, a BSG film (boron-containing $SiO_2$ film) and a TEOS film ($SiO_2$ film formed through a CVD method with the use of TEOS (tetraethoxysilane)).

Figure 8A:
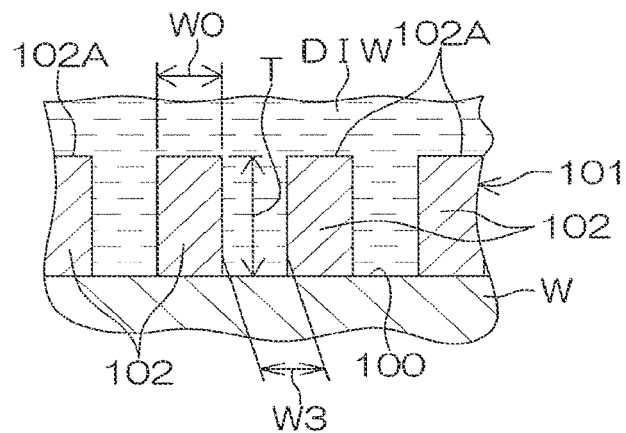
FIGS. 8A to 8D are schematic sectional views for explaining the states of an upper surface of the wafer in the exemplary process of FIG. 6.

The minute pattern 101 has a film thickness T of, for example, about 50 nm to about 5 μm (see FIG. 8A). The minute pattern 101 has an aspect ratio (the ratio of the film thickness T to the line width W0) of, for example, about 5 to about 500 (typically about 5 to about 50).

When the wafer W formed with the minute pattern 101 is dried, an attractive force is liable to act between adjacent structures 102 to collapse the minute pattern 101 during the drying of the wafer W.

Referring next to FIGS. 1 and 2 and FIGS. 6 to 7I, the etching process to be performed by the substrate treatment apparatus 1 will be described.

As shown in FIG. 7A, the wafer W loaded into the treatment chamber 3 by the robot (not shown) is transferred onto the lower abutment pins 12 provided on the rotation ring 11, and retained on the lower abutment pins 12 (S1: Wafer loading step). Thus, the loaded wafer W is held by the substrate holding/rotating mechanism 4 with its front surface (formed with the minute pattern 101) facing up.

When the wafer W is loaded in, the lid member 10 is located at the open position so as not to hinder the loading of the wafer W. Further, the heater 5 is located at the lower position in an ON state (in a driven state). The etching liquid nozzle 6 and the rinse liquid nozzle 7 are respectively located at their home positions (not shown in FIG. 7A).

Figure 7B:
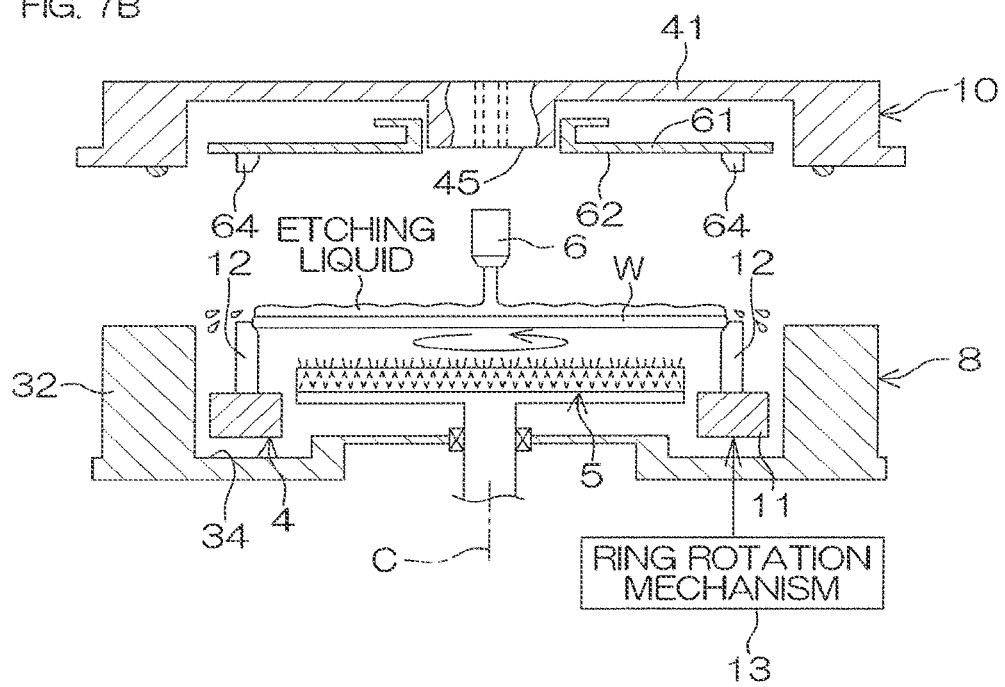

After the wafer W is held by the substrate holding/rotating mechanism 4, as shown in FIG. 7B, the controller 70 controls the ring rotation mechanism 13 to start rotating the wafer W. The rotation speed of the wafer W is increased up to a predetermined substrate treatment rotation speed (e.g., about 300 to about 1500 rpm).

The controller 70 controls the etching liquid nozzle movement mechanism 23 (see FIG. 1 and the like) to move the etching liquid nozzle 6 to the position above the wafer W, whereby the etching liquid nozzle 6 is located on the rotation axis C of the wafer W as shown in FIG. 7B.

After the etching liquid nozzle 6 is located on the rotation axis C of the wafer W, as shown in FIG. 7B, the controller 70 opens the etching liquid valve 22 (see FIG. 1 and the like) to spout the etching liquid from the etching liquid nozzle 6. The etching liquid is supplied to the upper surface center portion of the wafer W, and receives a centrifugal force generated by the rotation of the wafer W to flow toward the peripheral edge of the wafer W on the upper surface of the wafer W. Thus, the etching liquid spreads over the entire upper surface of the wafer W, whereby the upper surface of the wafer W is etched (S2: Etching step).

The etching liquid is scattered around from the peripheral edge of the wafer W and received by the inner surface of the peripheral wall 32 of the lower cup 8, and flows down on the inner surface to be collected in the annular groove 34. The etching liquid collected in the annular groove 34 is sent to the external waste liquid facility (not shown) through the waste liquid passage (not shown), and treated in the waste liquid facility.

After a lapse of a predetermined etching period from the start of the spouting of the etching liquid, the controller 70 closes the etching liquid valve 22 to stop spouting the etching liquid from the etching liquid nozzle 6, and controls the etching liquid nozzle movement mechanism 23 to move the etching liquid nozzle 6 back to its home position after the spouting of the etching liquid is stopped.

Figure 7C:
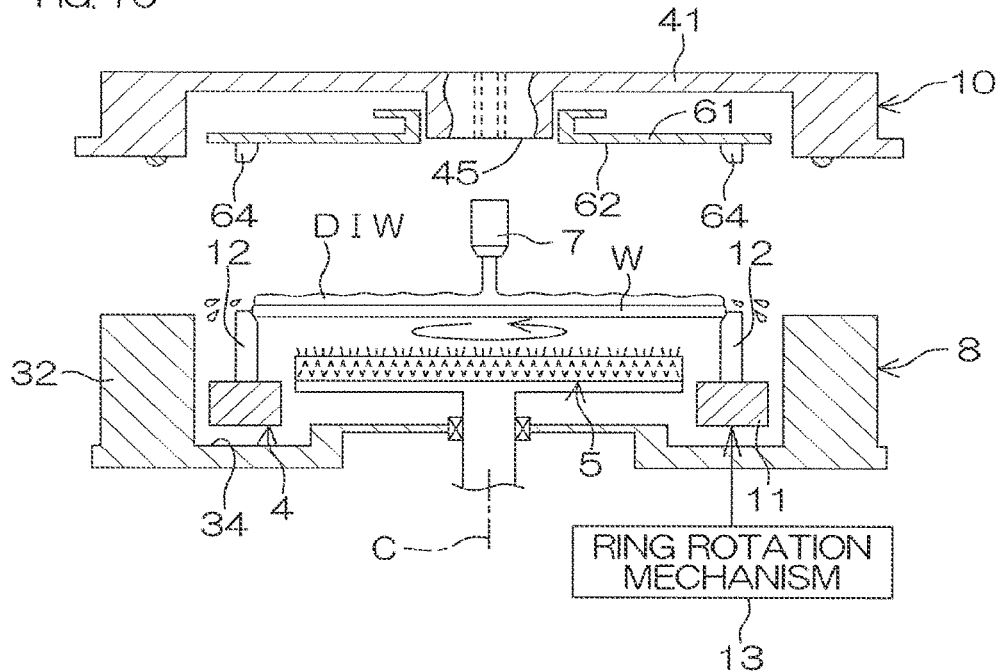

In turn, the controller 70 controls the rinse liquid nozzle movement mechanism 28 (see FIG. 1 and the like) to move the rinse liquid nozzle 7 to the position above the wafer W to locate the rinse liquid nozzle 7 on the rotation axis C of the wafer W as shown in FIG. 7C.

After the rinse liquid nozzle 7 is located on the rotation axis C of the wafer W, as shown in FIG. 7C, the controller 70 opens the rinse liquid valve 27 (see FIG. 1 and the like) to spout the DIW from the rinse liquid nozzle 7. The DIW is supplied to the upper surface center portion of the wafer W, and receives a centrifugal force generated by the rotation of the wafer W to flow toward the peripheral edge of the wafer W on the upper surface of the wafer W. Thus, the DIW spreads over the entire upper surface of the wafer W to rinse away the etching liquid adhering to the upper surface of the wafer W (Step S3: Rinsing step). In the rinsing step, as shown in FIG. 8A, the DIW spreads to bottoms of the gaps of the minute pattern 101 formed on the upper surface 100 of the wafer W (to portions of the gaps very close to the upper surface 100 of the wafer W).

The DIW (DIW containing the etching liquid) is scattered around from the peripheral edge of the wafer W and received by the inner surface of the peripheral wall 32 of the lower cup 8, and flows on the inner surface to be collected in the annular groove 34. The DIW collected in the annular groove 34 is sent to the external waste liquid facility (not shown) through the waste liquid passage (not shown), and treated in the waste liquid facility.

After a lapse of a predetermined rinsing period from the start of the spouting of the DIW, the controller 70 closes the rinse liquid valve 27 to stop spouting the DIW from the rinse liquid nozzle 7, and controls the rinse liquid nozzle movement mechanism 28 to move the rinse liquid nozzle 7 back to its home position after the spouting of the DIW is stopped.

Figure 7D:
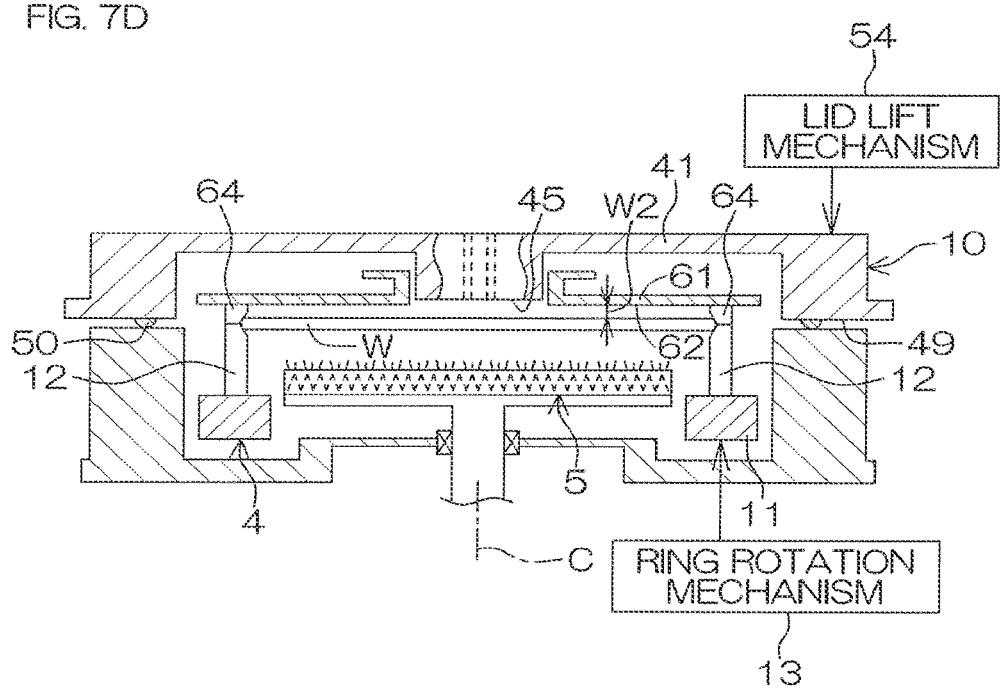

Subsequently, the controller 70 starts an IPA liquid supplying step (organic solvent supplying step) S4. The controller 70 first controls the ring rotation mechanism 13 to stop rotating the wafer W as shown in FIG. 7D. After the rotation of the wafer W is stopped, the controller 70 controls the ring rotation mechanism 13 to turn the substrate holding/rotating mechanism 4 and the inner lid 61 to their basic attitudes. Then, the lid lift mechanism 54 is controlled to move down the lid member 10 to the closed position. With the lid member 10 located at the closed position, the opening 9 of the lower cup 8 is closed with the lid member 10. When the lid member 10 and the lower cup 8 are connected to each other by a lock member (not shown) in this state, the seal ring 50 provided on the peripheral portion lower surface 49 of the outer lid 41 circumferentially abuts against the upper end face 33 of the lower cup 8 to seal the gap between the outer lid 41 and the lower cup 8. Thus, the internal space defined by the lower cup 8 and the lid member 10 is enclosed.

With the lid member 10 located at the closed position, the substrate opposing surface 62 of the inner lid 61 is spaced the minute distance W2 from the upper surface of the wafer W.

Figure 7E:
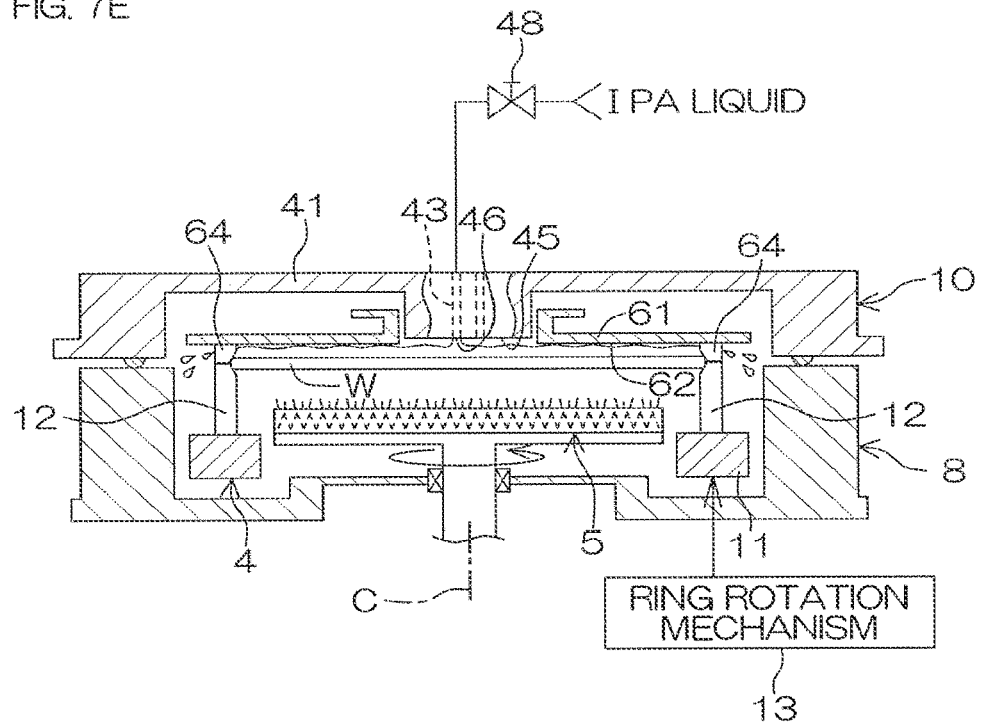
Figure 7F:
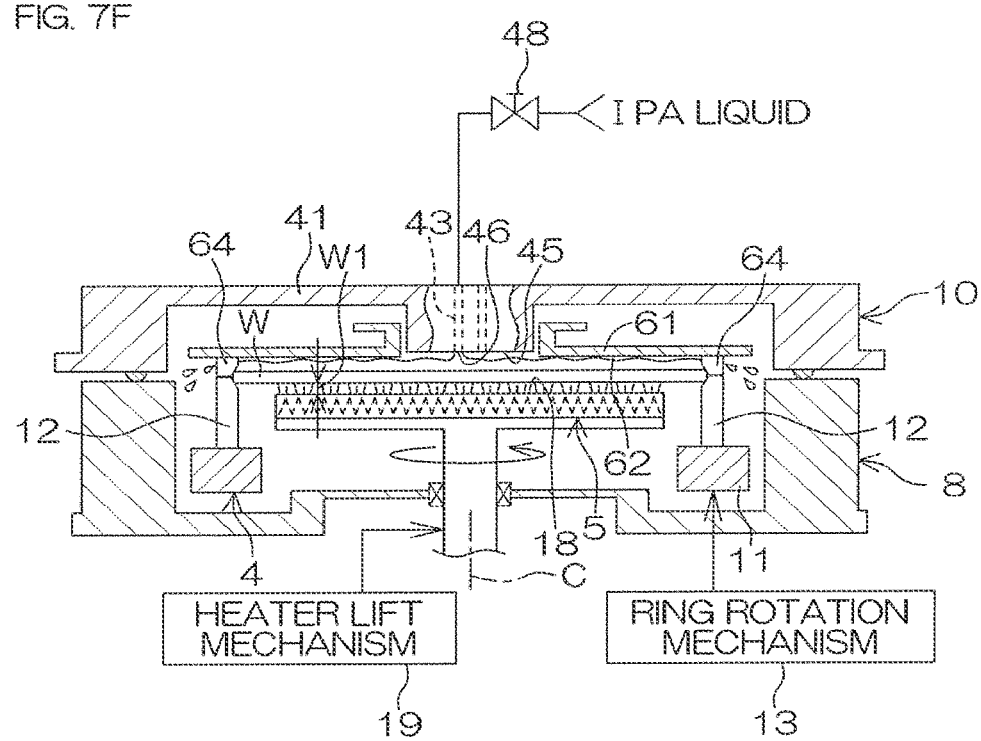

After the lid member 10 and the lower cup 8 are connected to each other, as shown in FIG. 7E, the controller 70 controls the ring rotation mechanism 13 to start rotating the rotation ring 11. Thus, the wafer W and the inner lid 61 are rotated at the same rotation speed in the same direction as the rotation ring 11.

After the rotation speed of the wafer W reaches a predetermined rotation speed (e.g., in a range of 10 to 1000 rpm, desirably 1000 rpm), as shown in FIG. 7E, the controller 70 opens the organic solvent valve 48 to spout the IPA liquid from the organic solvent outlet port 46 of the organic solvent flow pipe 43. At this time, the heater 5 is located at the lower position. Since the heater 5 is not located adjacent the wafer W, the wafer W is not heated by the heater 5. Therefore, the temperature of the upper surface of the wafer W is, for example, an ordinary temperature (e.g., 25° C.). Further, the temperature of the IPA liquid to be supplied to the wafer W is also an ordinary temperature. That is, the upper surface of the wafer W and the IPA liquid to be supplied to the upper surface of the wafer W each have a temperature not higher than the boiling point of the IPA liquid.

Figure 8B:
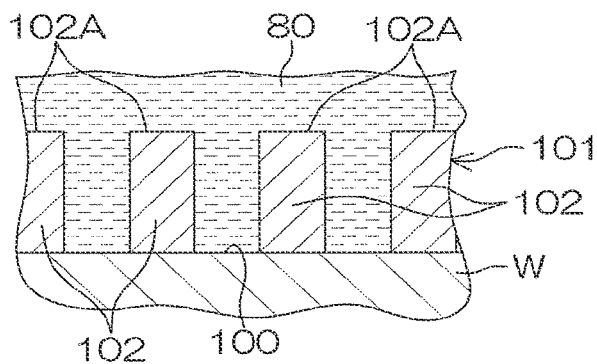
Figure 8C:
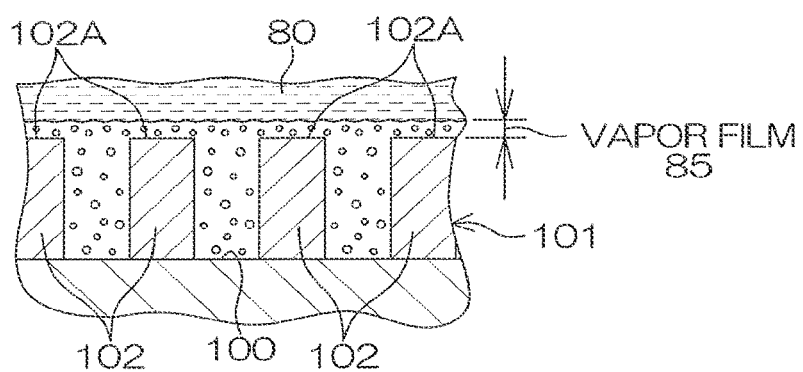

The IPA liquid is supplied to the center portion of the upper surface of the wafer W, and receives a centrifugal force generated by the rotation of the wafer W to flow toward the peripheral edge of the wafer W between the upper surface of the wafer W and the substrate opposing surface 62 of the inner lid 61. Thus, the IPA liquid spreads over the entire upper surface of the wafer W, whereby the DIW present on the upper surface of the wafer W is replaced with the IPA liquid. Since the IPA supplied to the upper surface of the wafer W is liquid (in a liquid phase), the DIW present in the gaps of the minute pattern 101 is properly replaced with the IPA liquid as shown in FIG. 8B. Thus, the DIW can be reliably removed from the upper surface of the wafer W.

After a lapse of a predetermined IPA replacing period from the start of the spouting of the IPA liquid, an IPA liquid film 80 having a predetermined thickness (e.g., about 1 mm) is formed on the entire upper surface of the wafer W. The IPA replacing period is set to a period sufficient to replace the DIW on the upper surface of the wafer W with the IPA liquid.

Upon completion of the replacement with the IPA, as shown in FIG. 7F, the controller 70 controls the heater lift mechanism 19 to move up the heater 5 to the upper position. Thus, a wafer heating step (S5) is performed.

After the heater 5 is moved up to the upper position, the upper surface 18 of the heater 5 is located closer to the lower surface of the wafer W at the distance W1 (typically 0.5 to 3 mm) from the lower surface of the wafer W. After the heater 5 reaches the upper position, the lower surface of the wafer W is heated through heat radiation from the heater 5 or through internal fluid heat conduction between the lower surface of the wafer W and the upper surface 18 of the heater 5. With the heater 5 located at the upper position, the upper surface 18 of the heater 5 is disposed parallel to the lower surface of the wafer W. Thus, the amount of heat supplied per unit area to the wafer W from the heater 5 is generally uniform over the entire wafer W.

In this embodiment, the upper position of the heater 5 is such that the upper surface 18 of the heater 5 is located adjacent the lower surface of the wafer W, but may be such that the upper surface 18 of the heater 5 and the lower surface of the wafer W partly or entirely contact each other.

With the lower surface of the wafer W heated by the heater 5, the temperature of the entire upper surface of the wafer W (the upper surface of the minute pattern 101 (see FIGS. 8A to 8D), more specifically, upper end faces 102A of the respective structures 102) is increased to a predetermined heating upper surface temperature. The heating upper surface temperature is a predetermined temperature higher by 10° C. to 50° C. than the boiling point (82.4° C.) of the IPA liquid.

In this embodiment, the amount of heat per unit area of the heater 5 and the distance W1 between the upper surface of the wafer W and the upper surface 18 of the heater 5 are predetermined so that the entire upper surface of the wafer W can be heated up to the heating upper surface temperature.

After a lapse of a predetermined period from the time at which the temperature of the upper surface of the wafer W reaches the heating upper surface temperature, the IPA liquid film 80 present on the upper surface of the wafer W is partly evaporated into a gas phase to fill the gaps of the minute pattern 101 and to form an IPA vapor film 85 above the upper surface of the wafer W (the upper end faces 102A of the structures 102). Thus, the IPA liquid film 80 is levitated above the upper surface of the wafer W (the upper end faces 102A of the structures 102) (see FIG. 8C).

At this time, the gaps of the minute pattern 101 are filled with the gas-phase organic solvent, which has a very small surface tension between the structures 102 of the minute pattern 101. Thus, the collapse of the minute pattern 101 can be prevented which may otherwise occur due to the surface tension.

The heating of the wafer W is continued at least until the IPA liquid film 80 is levitated above the entire upper surface of the wafer W and the IPA liquid present in the gaps of the minute pattern 101 is gasified.

In turn, the controller 70 performs an IPA removing step (organic solvent removing step) S6 to remove the IPA liquid film 80 levitated above the wafer W in the form of liquid mass from the upper surface of the wafer W. At this stage, the IPA liquid film 80 does not contact the upper surface of the wafer W and, therefore, is easily moved along the upper surface of the wafer W.

Figure 8D:
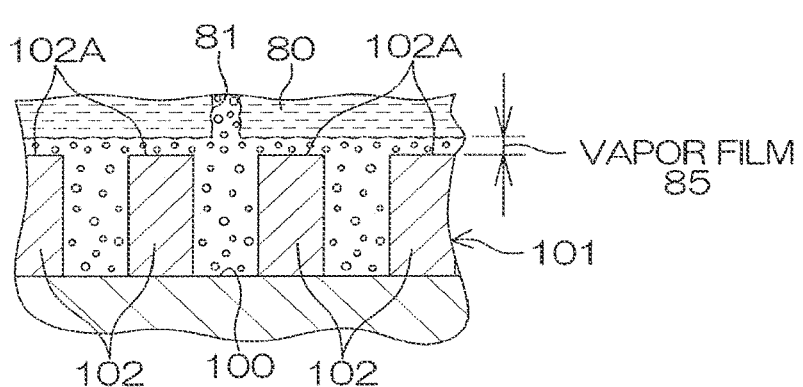

The IPA liquid film 80 levitated above the upper surface of the wafer W often suffers from cleavage 81 or the like (see FIG. 8D). In a portion of the IPA liquid film 80 suffering from the cleavage 81 or the like, liquid-solid interfaces are present between IPA liquid droplets and the wafer W and, in this state, the wafer W is dried. Therefore, the collapse of the pattern is liable to occur due to the surface tension. Further, the upper surface of the wafer W is liable to suffer from a defective such as a water mark.

Therefore, it is desirable to prevent the cleavage 81 from occurring in the IPA liquid film 80 until the IPA liquid film 80 is removed from the upper surface of the wafer W in the IPA removing step (S6).

There are two conceivable factors which cause the cleavage 81 in the IPA liquid film 80.

A first factor is the generation of a great amount of IPA vapor or the boiling of the IPA liquid film 80 due to the heating of the wafer W for a longer period of time. If a great amount of IPA vapor is generated or the IPA liquid film 80 boils, the IPA vapor film 85 cleaves through the IPA liquid film 80 to above the liquid film 80 to cause the cleavage 81.

A second factor is the splitting of the IPA liquid film 80 due to a centrifugal force generated by higher-speed rotation of the wafer W.

To cope with the first factor, in this embodiment, the wafer heating temperature and the wafer heating period are set such that the cleavage 81 can be prevented. Further, the IPA liquid is additionally supplied to the IPA liquid film 80 at proper timing during the heating of the wafer W, whereby the IPA liquid film 80 continuously has a thickness (e.g., 1 to 5 mm, desirably about 3 mm, at the center of the wafer W) such that the IPA liquid film 80 is free from the cleavage 81 in the wafer heating step (S5) and the IPA removing step (S6).

To cope with the second factor, in this embodiment, the rotation speed of the wafer W is set such that the IPA liquid film 80 is free from the cleavage 81 in the wafer heating step (S5). Where the wafer W is rotated at 10 to 500 rpm, for example, it is possible to retain the IPA liquid film 80 on the entire upper surface of the wafer W while preventing the splitting of the liquid film 80 which may otherwise occur due to the centrifugal force.

Figure 7G:
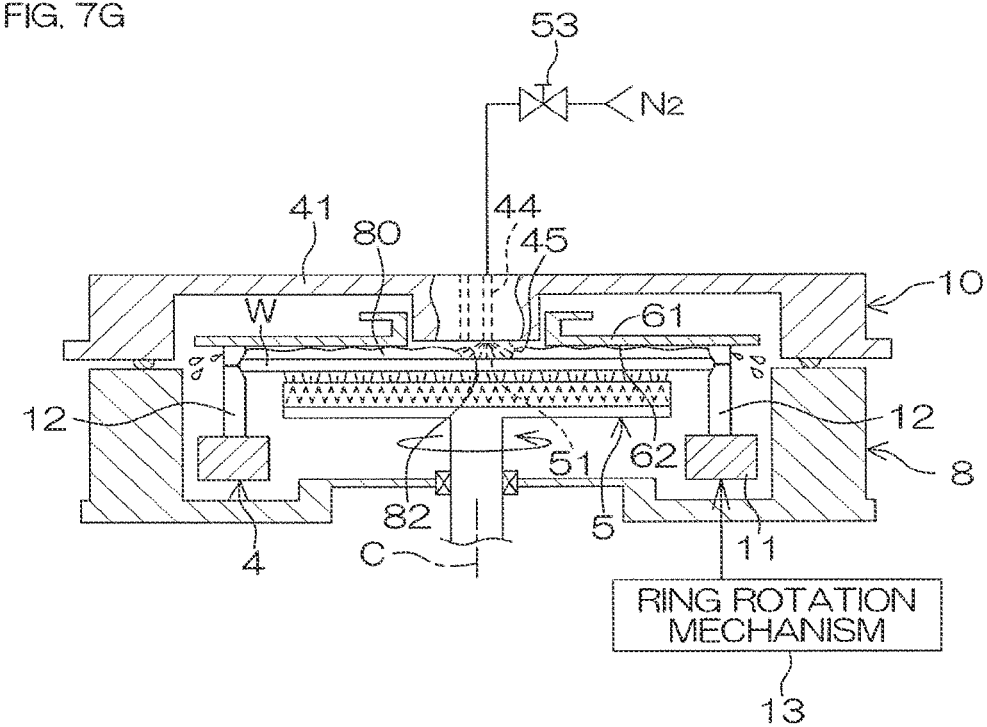

Back to the description of the IPA removing step (S6), as shown in FIG. 7G, the controller 70 controls the rotation speed of the wafer W to 10 to 500 rpm, for example, and opens the nitrogen gas valve 53. At this time, the opening degree of the flow rate control valve 55 (see FIG. 1 and the like) is set such that the nitrogen gas ($N_2$) is spouted at a lower flow rate from the nitrogen gas outlet port 51. Thus, the nitrogen gas is spouted at the lower flow rate from the nitrogen gas outlet port 51 to be sprayed onto the upper surface center portion of the wafer W. In this manner, the IPA liquid film 80 is partly removed from the upper surface center portion of the wafer W, whereby a dry region 82 having a smaller-diameter round shape is formed.

The IPA liquid film 80 is spaced away from the upper surface of the wafer W (the upper surface of the minute pattern 101) via the IPA vapor film 85 (see FIG. 8C and the like) and, therefore, is easily moved along the upper surface of the wafer W. Accordingly, the dry region 82 is expanded as the nitrogen gas is spouted toward the upper surface center portion of the wafer W. The centrifugal force generated by the rotation of the wafer W acts on the IPA liquid film 80, so that the dry region 82 is further quickly expanded. The dry region 82 is thus expanded over the entire upper surface of the wafer W, whereby the IPA liquid can be removed in the form of liquid mass from the upper surface of the wafer W (the upper surface of the minute pattern 101) (without disintegrating into a multiplicity of liquid droplets).

Figure 7H:
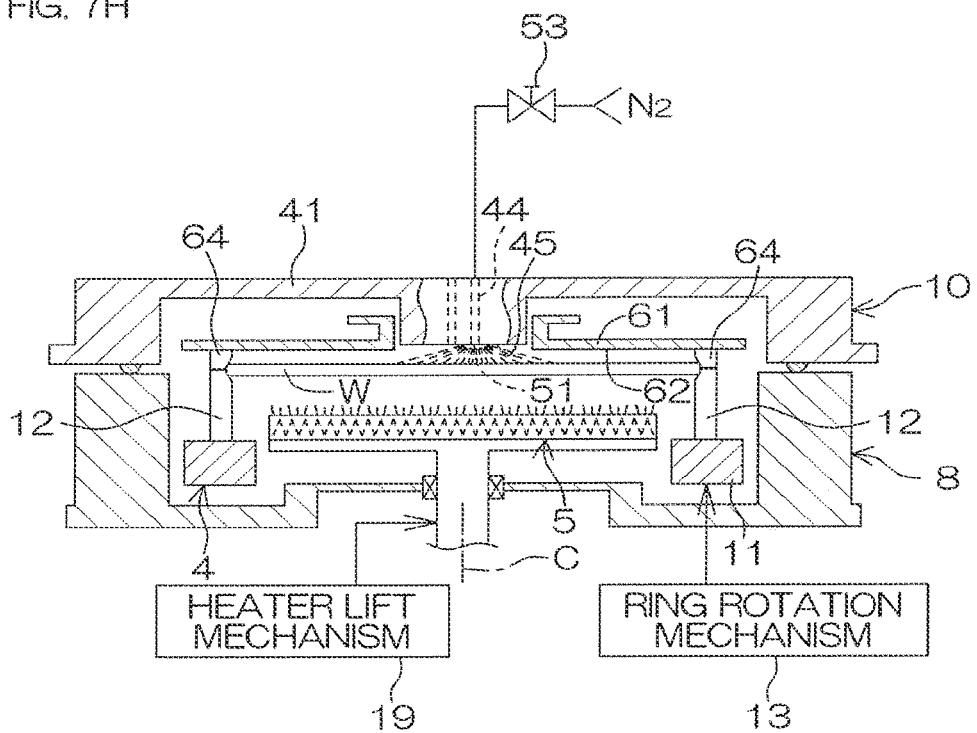
Figure 7I:
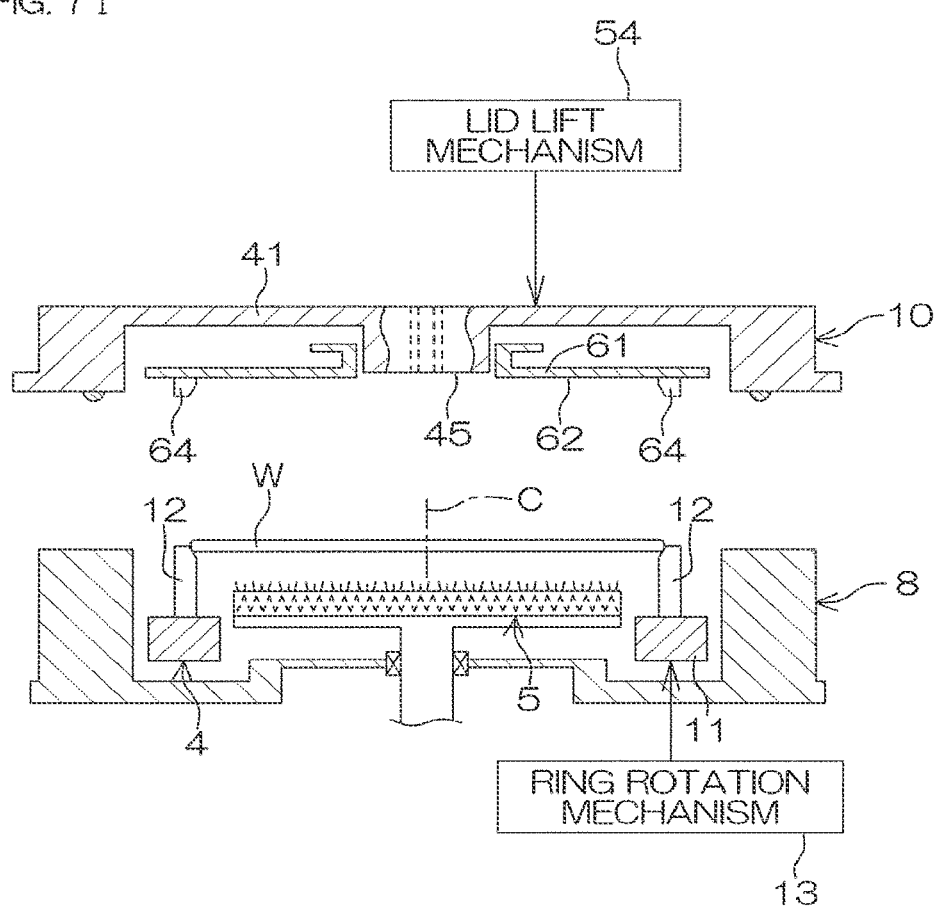

After the IPA liquid film 80 is completely removed from the upper surface of the wafer W, as shown in FIG. 7H, the controller 70 controls the heater lift mechanism 19 to move the heater 5 down to the lower position. With the heater 5 located at the lower position, the heater 5 and the wafer W are spaced a greater distance from each other, so that a sufficient amount of heat does not reach the wafer W (through the heat radiation or through the internal fluid heat conduction). Thus, the heating of the wafer W by the heater 5 ends, whereby the temperature of the wafer W is reduced substantially to the ordinary temperature.

The controller 70 controls the flow rate control valve 55 (see FIG. 1) to significantly increase the amount of the nitrogen gas to be spouted from the nitrogen gas outlet port 51. Thus, the stream of the nitrogen gas flowing from the center portion to the peripheral portion of the wafer W between the upper surface of the wafer W and the substrate opposing surface 62 of the inner lid 61 is enhanced and promoted, whereby a space defined between the upper surface of the wafer W and the substrate opposing surface 62 of the inner lid 61 is filled with the nitrogen gas.

At the same time, the controller 70 controls the ring rotation mechanism 13 to increase the rotation speed of the wafer W to a predetermined drying rotation speed (e.g., 2500 rpm). Thus, the IPA liquid is completely spun off from the wafer W (S7: Spin drying step). In the spin drying step, the inner lid 61 is continuously spaced the distance W2 from the wafer W, and rotated in the same direction as the wafer W in synchronization with the rotation of the wafer W, so that an atmosphere on the upper surface of the wafer W is isolated from the ambient atmosphere. Thus, the stream is stably formed between the upper surface of the wafer W and the substrate opposing surface 62 of the inner lid 61.

After the wafer W is continuously rotated at the drying rotation speed for a predetermined period, as shown in FIG. 7H, the controller 70 controls the ring rotation mechanism 13 to stop rotating the wafer W, and closes the nitrogen gas valve 53. Further, the controller 70 drives the lid lift mechanism 54 to move the lid member 10 up to the open position. Thus, the etching process for the single wafer W is completed, and the treated wafer W is unloaded from the treatment chamber 3 (see FIG. 1 and the like) by the transport robot (Step S8).

In this embodiment, the dry region 82 is first formed on the center portion of the wafer W and gradually expanded by the centrifugal force to remove the IPA liquid in the IPA removing step S6. Therefore, the IPA liquid can be removed from the upper surface of the wafer W in the form of relatively large liquid mass. This eliminates the possibility that the IPA liquid remains in the form of liquid droplets on the upper surface of the wafer W. Thus, the IPA liquid is reliably prevented from being dried or disappearing in the form of liquid droplets on the upper surface of the wafer W.

Where the minute pattern 101 on the upper surface 100 of the wafer W has a higher aspect ratio, it is considered that the area of contact between the liquid-phase IPA and the structures 102 of the minute pattern 101 is increased, thereby increasing the time required for evaporating the liquid-phase IPA present between the adjacent structures 102. In this case, an increased amount of heat is required for evaporating the IPA liquid film 80 located adjacent the upper surface of the wafer W. Therefore, it is considered desirable to increase the wafer heating temperature or the wafer heating period according to the aspect ratio of the minute pattern 101 of the wafer W to be treated.

In the exemplary etching process, the steps S5 to S7 employing the IPA liquid are performed in such a state that the wafer W is accommodated together with the substrate holding/rotating mechanism 4 in the internal space of the enclosure cup defined by the lower cup 8 and the lid member 10. In these steps in which the IPA liquid is handled in a higher temperature environment, there is a possibility that a violent reaction occurs on the wafer w. However, the wafer W is accommodated in the enclosure cup, thereby preventing a damage to a portion of the substrate treatment apparatus 1 outside the enclosure cup.

Next, a second embodiment of the present invention will be described. In the second embodiment, the etching process is performed in substantially the same manner as in the first embodiment, but only the IPA removing step S6 differs. Therefore, components associated with this step will be mainly described.

Figure 9:
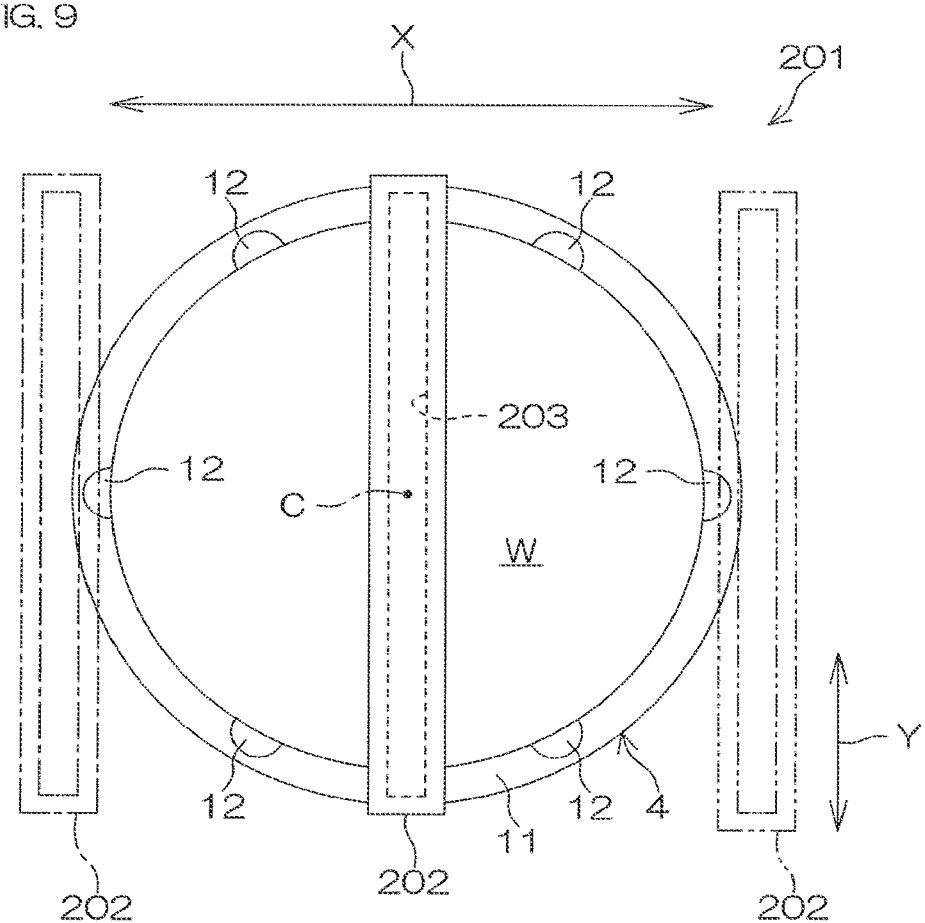
FIG. 9 is a plan view showing a substrate treatment apparatus according to a second embodiment of the present invention.
Figure 10:
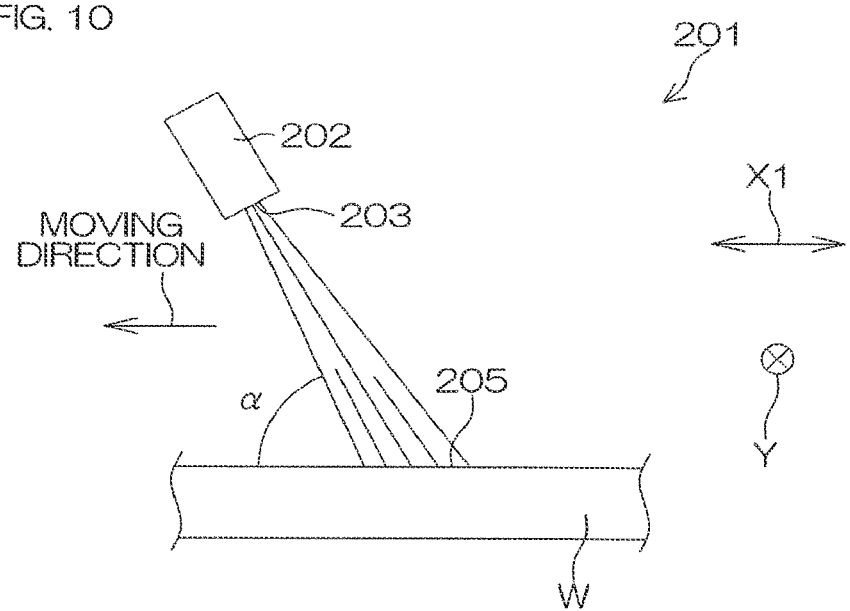
FIG. 10 is a side view showing an IPA removing step to be performed by the substrate treatment apparatus according to the second embodiment of the present invention.

FIG. 9 is a plan view illustrating a substrate treatment apparatus 201 according to the second embodiment of the present invention. FIG. 10 is a side view showing an IPA removing step to be performed by the substrate treatment apparatus 201. In FIGS. 9 and 10, components corresponding to those in the first embodiment will be designated by the same reference characters as in FIGS. 1 to 7I, and duplicate description will be omitted.

In the substrate treatment apparatus 1 according to the first embodiment, the nitrogen gas is spouted from the nitrogen gas outlet port 51 disposed in opposed relation to the upper surface of the wafer W. In the second embodiment, a linear gas spray nozzle 202 as shown in FIG. 9 is used to spout an inert gas in the form of linear zone stream toward the upper surface of the wafer W. The gas spray nozzle 202 has a slit outlet port 203 which linearly opens as extending along a predetermined Y-axis. The slit outlet port 203 is opposed to the upper surface of the wafer W held by the substrate holding/rotating mechanism 4. The gas spray nozzle 202 is supported by support rails (not shown) so as to be reciprocally movable along an X-axis perpendicular to the Y-axis. The X-axis and the Y-axis are parallel to the upper surface of the wafer W (horizontally extend). Nitrogen gas is supplied to the gas spray nozzle 202 from the nitrogen gas supply source.

As shown in FIG. 10, a nitrogen gas spraying direction α in which the nitrogen gas is sprayed onto the upper surface of the wafer W from the slit outlet port 203 is a predetermined acute angle (e.g., 45 degrees).

According to this method, the nitrogen gas is sprayed in the form of linear (zone) stream onto the upper surface of the wafer W from the gas spray nozzle 202 in the IPA removing step of Step S6 (see FIG. 6). Thus, a linear nitrogen gas spray zone 205 is defined on the upper surface of the wafer W as extending along the Y-axis. Simultaneously with the spraying of the nitrogen gas, the gas spray nozzle 202 is moved along the X-axis (scanned in one direction) from a movement start position defined outside an upper region present above the wafer W (as indicated by a two-dot-and-dash line in FIG. 9) to a return position defined on an opposite side from the movement start position with respect to the rotation center of the wafer W outside the upper region present above the wafer W (as indicated by a one-dot-and-dash line in FIG. 9). Thus, the nitrogen gas spraying zone 205 is moved along the X-axis.

Where the slit outlet port 203 of the gas spray nozzle 202 is located above the rotation center of the wafer W (on the rotation axis C), opposite ends of the slit outlet port 203 defined with respect to the Y-axis are located outside the upper region present above the wafer W. Therefore, the entire upper surface of the wafer W is scanned with the nitrogen gas spraying zone 205 by thus moving the gas spray nozzle 202 in one direction from the movement start position to the return position.

In the wafer heating step of Step S5 (see FIG. 6), as described above, the IPA liquid film 80 (see FIG. 8C) is easily moved along the upper surface of the wafer W substantially without friction between the IPA liquid film 80 and the upper surface of the wafer W. By thus moving the nitrogen gas spraying zone 205, the IPA liquid film 80 can be moved in the moving direction of the nitrogen gas spraying zone 205. Thus, the IPA liquid film 80 can be properly removed from the upper surface of the wafer W without the collapse of the pattern.

In the first and second embodiments described above, the nitrogen gas is spouted from the nitrogen gas outlet port disposed in opposed relation to the upper surface of the wafer W, whereby the IPA liquid film 80 levitated above the wafer W via the vapor film 85 is removed from the upper surface of the wafer W. However, the method of removing the IPA liquid film 80 after the etching step, the rinsing step, the IPA liquid supplying step and the wafer heating step described in the first embodiment is not limited to this method. The IPA liquid film 80 may be removed from the wafer W by the following methods shown in FIGS. 11A to 15C.

Figure 11A:
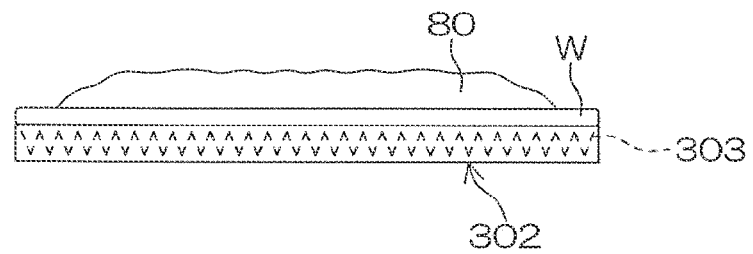
FIGS. 11A to 11C are diagrams for explaining an example of the IPA removing step.
Figure 11B:
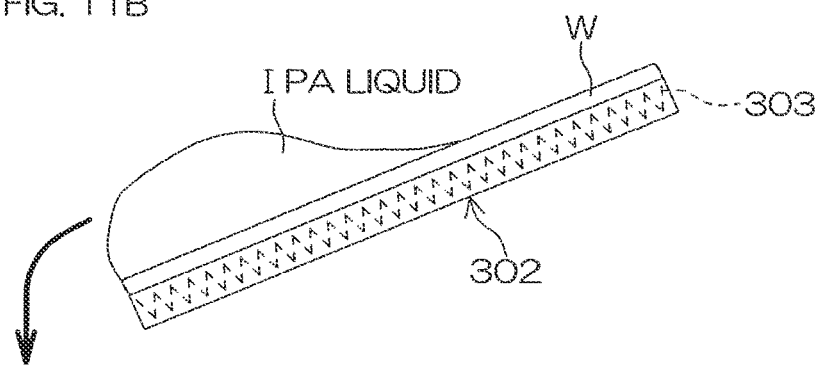
Figure 11C:
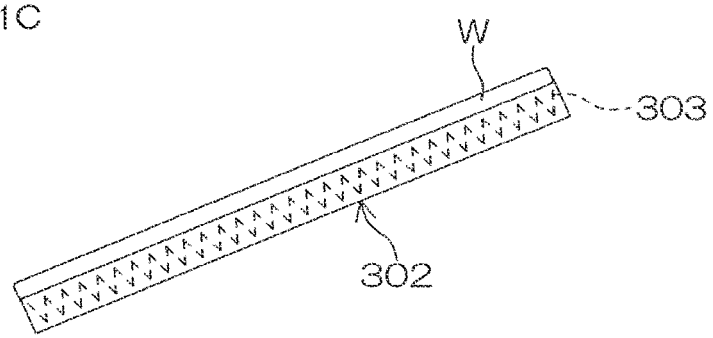

In a method shown in FIGS. 11A to 11C, the IPA liquid film 80 levitated above the wafer W is slid down by the gravity to be thereby removed from the upper surface of the wafer W. In FIG. 11A, the wafer W is heated to a temperature not lower than the boiling point of the IPA by a heater 303 provided in a wafer holding unit 302, whereby the IPA vapor film 85 is formed on the upper surface of the wafer W. The IPA liquid film 80 is levitated above the wafer W by the vapor film 85 (see FIG. 8C). In this state, the wafer holding unit 302 is turned about a rotation axis (not shown) to be tilted as shown in FIG. 11B, whereby the IPA liquid film 80 is slid down from the upper surface of the wafer W to be removed from the upper surface of the wafer W (see FIG. 11C).

Figure 12A:
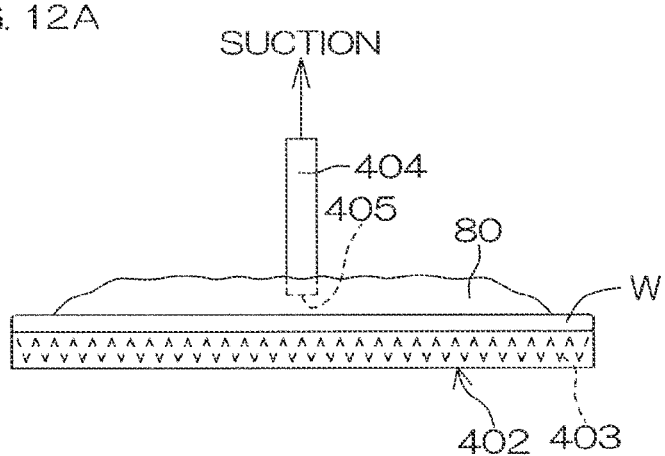
FIGS. 12A to 12C are diagrams for explaining another example of the IPA removing step.
Figure 12B:
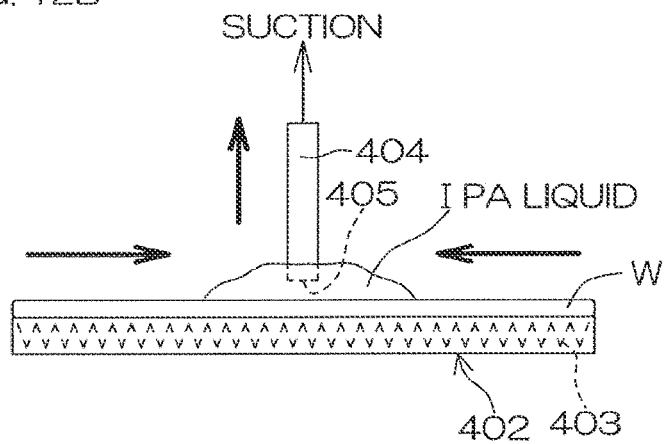
Figure 12C:
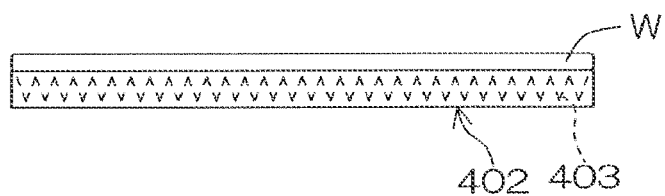

The IPA liquid film 80 levitated above the wafer W may be removed from the upper surface of the wafer W by the method shown in FIGS. 12A to 12C. In FIG. 12A, the wafer W is heated to a temperature not lower than the boiling point of the IPA by a heater 403 provided in a wafer holding unit 402, whereby the IPA vapor film 85 is formed on the upper surface of the wafer W. The IPA liquid film 80 is levitated above the wafer W by the vapor film 85 (see FIG. 8C). In this method, a suction nozzle 404 is used. The suction nozzle 404 has an open end which serves as a suction port 405. The suction nozzle 404 is connected to a vacuum generator (not shown).

In the IPA removing step, the suction nozzle 404 is disposed with the suction port 405 thereof in adjacent opposed relation to the upper surface center portion of the wafer W. Then, the vacuum generator is driven to suck the inside of the suction port 405. Thus, a center portion of the IPA liquid film 80 present on the upper surface center portion of the wafer W is sucked into the suction port 405. At the same time, as shown in FIG. 12B, the other portion of the IPA liquid film 80 present on the other upper surface portion of the wafer W is drawn by the center portion of the IPA liquid film 80 to sequentially move toward the upper surface center portion of the wafer W, and is sucked into the suction port 405 to be removed from the upper surface of the wafer W.

Figure 13A:
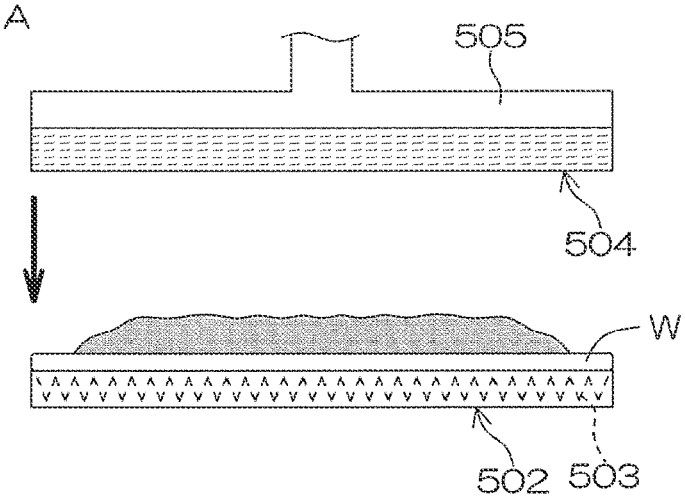
FIGS. 13A to 13C are diagrams for explaining further another example of the IPA removing step.
Figure 13B:
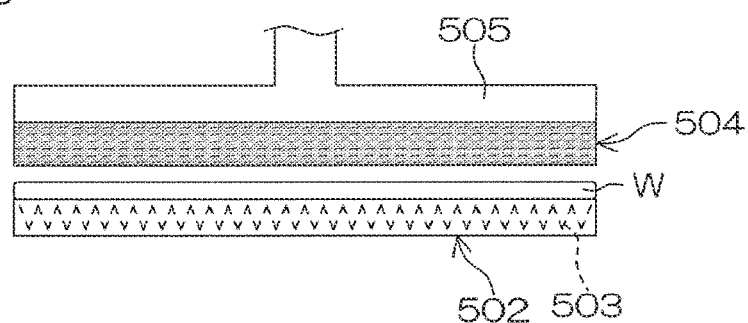
Figure 13C:
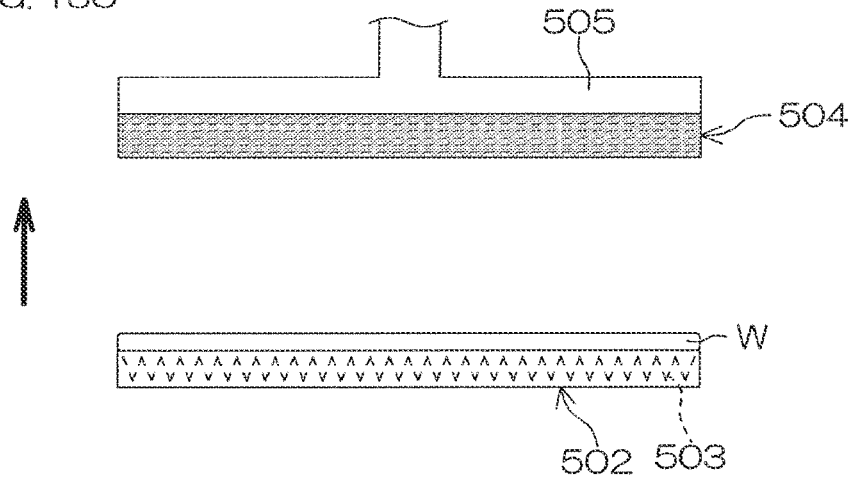

A sponge wipe 504 as shown in FIGS. 13A to 13C may be used instead of the suction nozzle 404 described with reference to FIGS. 12A to 12C to remove the IPA liquid film 80.

In FIG. 13A, the wafer W is heated to a temperature not lower than the boiling point of the IPA by a heater 503 provided in a wafer holding unit 502, whereby the IPA vapor film 85 is formed on the upper surface of the wafer W. The IPA liquid film 80 is levitated above the wafer W by the vapor film 85 (see FIG. 8C). The sponge wipe 504 has a disk shape like the wafer W, and has a water absorbing property. The sponge wipe 504 is supported by a holder 505 from above. In the IPA removing step, as shown in FIG. 13A, the sponge wipe 504 is moved down into adjacent relation to the upper surface of the wafer W. Thus, the IPA liquid film 80 above the upper surface of the wafer W is absorbed by the sponge wipe 504 (see FIG. 13B). In this state, as shown in FIG. 13C, the sponge wipe 504 is move up, whereby the IPA liquid film 80 is removed from the upper surface of the wafer W. Thus, the IPA liquid film 80 can be properly removed from the upper surface of the wafer W without the collapse of the pattern.

Figure 14A:
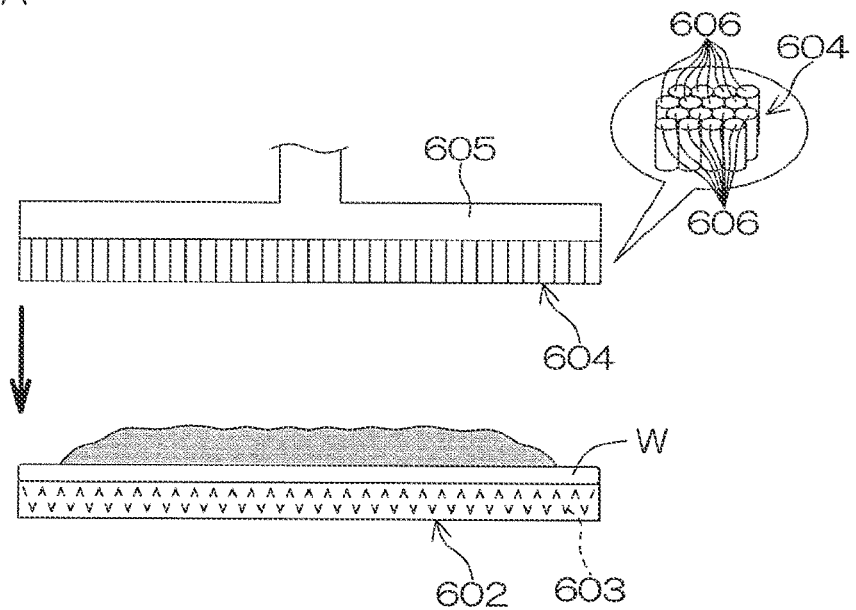
FIGS. 14A to 14C are diagrams for explaining still another example of the IPA removing step.
Figure 14B:
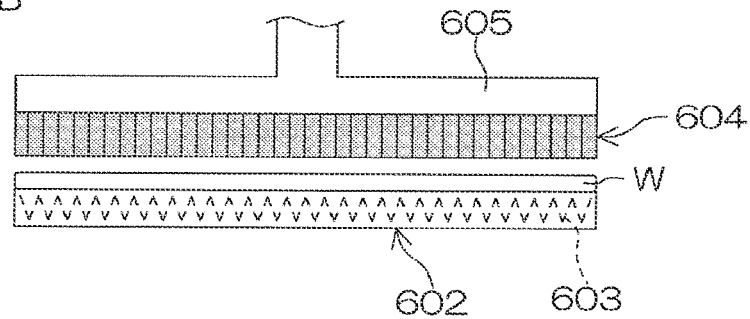
Figure 14C:
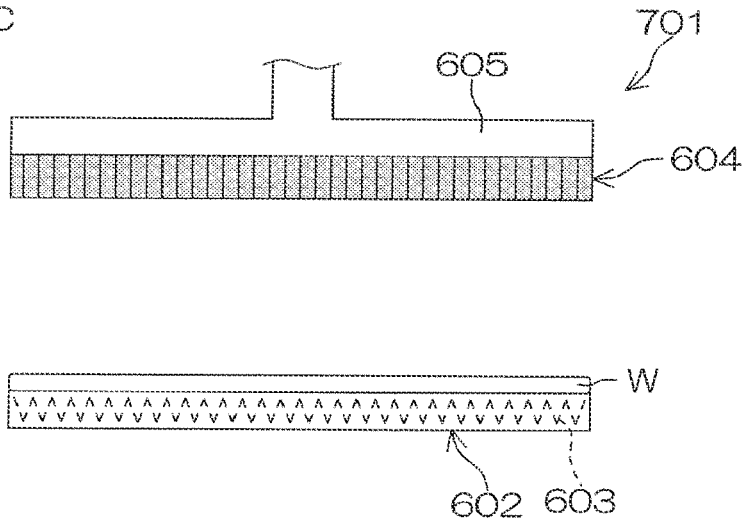

A capillary head 604 including a multiplicity of vertically extending short capillary tubes 606 bundled together as shown in FIGS. 14A to 14C may be used instead of the suction nozzle 404 described with reference to FIGS. 12A to 12C or the sponge wipe 504 described with reference to FIGS. 13A to 13C. In FIG. 14A, the wafer W is heated to a temperature not lower than the boiling point of the IPA by a heater 603 provided in a wafer holding unit 602, whereby the IPA vapor film 85 is formed on the upper surface of the wafer W. The IPA liquid film 80 is levitated above the wafer W by the vapor film 85 (see FIG. 8C). The capillary head 604 is disposed in opposed relation to the upper surface of the wafer W, and has a generally disk shape like the wafer W. The capillary head 604 is supported by a holder 605 from above.

In the IPA removing step, as shown in FIG. 14A, the capillary head 604 is moved down into adjacent relation to the upper surface of the wafer W. At this time, the IPA liquid film 80 above the upper surface of the wafer W is absorbed by the capillary head 604 through the capillarity of the capillary tubes 606 of the capillary head 604 (see FIG. 14B). In this state, as shown in FIG. 14C, the capillary head 604 is moved up, whereby the IPA liquid film 80 is removed from the upper surface of the wafer W. Thus, the IPA liquid film 80 can be properly removed from the upper surface of the wafer W without the collapse of the pattern.

Alternatively, the IPA liquid film 80 may be removed from the front surface of the wafer W by providing a temperature gradient on the front surface of the wafer W.

Figure 15A:
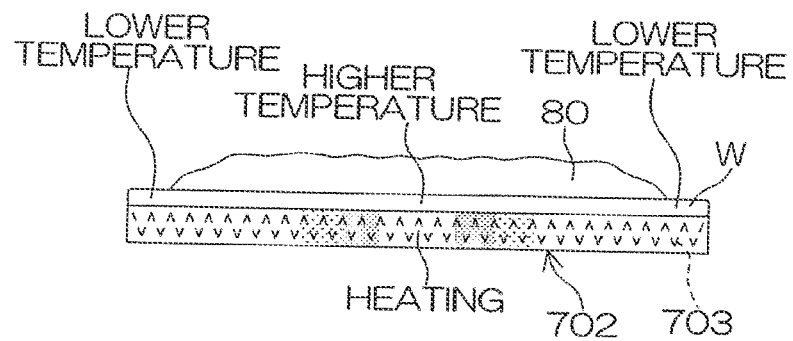
FIGS. 15A to 15C are diagrams for explaining further another example of the IPA removing step.

In FIG. 15A, the wafer W is placed on a wafer holding unit 702 including a heater 703 provided therein. The heater 703 has an upper surface divided into a multiplicity of areas which are each switchable between a heating-on state and a heating-off state. That is, the on/off switching operation can be controlled on an area basis.

The wafer W on the wafer holding unit 702 is heated through heat conduction from the heater 703 with all the areas of the heater 703 kept in the heating-on state. Through the heating by the heater 703, the IPA vapor film 85 is formed between the IPA liquid film 80 and the upper surface of the wafer W, whereby the IPA liquid film 80 is levitated above the upper surface of the wafer W (see FIG. 8C). In this state, the IPA liquid film 80 is easily moved along the upper surface of the wafer W substantially without friction between the IPA liquid film 80 and the upper surface of the wafer W.

In the IPA removing step, as shown in FIG. 15A, only an upper surface center portion of the heater 703 is kept in the heating-on state, while the other upper surface portion of the heater 703 is kept in the heating-off state. Thus, the upper surface center portion of the wafer W is heated to a higher temperature, while the other upper surface portion of the wafer W is kept at a lower temperature. The IPA liquid has a nature such as to move from a higher temperature part to a lower temperature part. Therefore, a part of the IPA liquid film 80 present above the upper surface center portion of the wafer W is moved toward the peripheral portion of the wafer W.

Figure 15B:
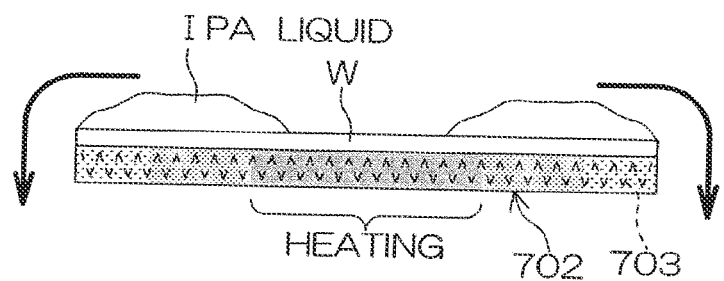
Figure 15C:
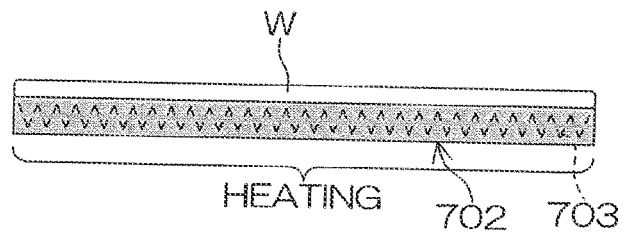

Thereafter, as shown in FIG. 15B, a heating area of the upper surface of the heater 703 is expanded toward the peripheral edge, and finally the entire upper surface of the heater 703 is heated (see FIG. 15C). Thus, a higher temperature portion of the upper surface of the wafer W is sequentially expanded from the upper surface center portion to the upper surface peripheral portion. Thus, the IPA liquid film 80 is moved to the peripheral portion of the wafer W to flow out of the wafer W. Therefore, the IPA liquid film 80 can be properly removed from the upper surface of the wafer W without the collapse of the pattern.

While two embodiments of the present invention have thus been described, the invention may be embodied in other ways.

In the first embodiment described above, the wafer W is continuously rotated during a period from the start of the IPA liquid supplying step (S4 in FIG. 6) to the end of the IPA removing step (S6 in FIG. 6) by way of example. Alternatively, the rotation speed of the wafer W may be maintained at zero or at a lower speed close to zero (e.g., a rotation speed of lower than 20 rpm) during a part of the period of the IPA liquid supplying step (S4 in FIG. 6) or the entire period of the IPA liquid supplying step. Further, the rotation speed of the wafer W may be maintained at zero or at a lower speed close to zero (e.g., a rotation speed of lower than 20 rpm) during a part of the period of the wafer heating step (S5 in FIG. 6) or the entire period of the wafer heating step.

For example, the wafer W is rotated at the predetermined rotation speed (e.g., 10 to 1000 rpm, desirably 1000 rpm) at the start of the IPA liquid supplying step (S4 in FIG. 6) as in the first embodiment described above. The IPA liquid supplied to the center portion of the upper surface of the wafer W receives a centrifugal force generated by the rotation of the wafer W to flow toward the peripheral edge of the wafer W between the upper surface of the wafer W and the substrate opposing surface 62 of the inner lid 61. Thus, the IPA liquid spreads over the entire upper surface of the wafer W, whereby the DIW present on the upper surface of the wafer W is replaced with the IPA liquid.

After a lapse of a predetermined period from the start of the IPA liquid supplying step (S4 in FIG. 6), the deceleration of the rotation of the wafer W is started, whereby the rotation speed of the wafer W is reduced to zero or to the lower speed close to zero before a lapse of the IPA replacing period. At the end of the IPA liquid supplying step (S4 in FIG. 6), therefore, no centrifugal force or only a small centrifugal force acts on the IPA liquid present on the wafer W, so that the IPA liquid does not flow out from the peripheral edge of the wafer W but retained on the upper surface of the wafer W. As a result, the IPA liquid film 80 is formed on the upper surface of the wafer W in a puddle state (the IPA liquid is retained on the upper surface of the wafer W to form the liquid film).

Then, the wafer heating step (S5 in FIG. 6) is performed with the rotation speed of the wafer W maintained at zero or at the lower speed close to zero. That is, the heater 5 is moved up to the upper position (see FIG. 7F) to heat the wafer W, while the IPA liquid film is retained on the wafer W in the puddle state. At this time, the rotation speed of the wafer W may be maintained at zero or at the lower speed close to zero during the entire period of the wafer heating step (S5 in FIG. 6).

In this case, no centrifugal force or only a small centrifugal force acts on the IPA liquid film 80 (see FIG. 8C) in the wafer heating step (S5 in FIG. 6), thereby more reliably preventing the cleavage of the IPA liquid film 80.

In the first embodiment, for example, the temperature of the upper surface of the wafer W may be kept at a predetermined temperature higher than the ordinary temperature and lower than the heating upper surface temperature during a period after the supply of the IPA liquid in Step S4 before the start of the heating of the wafer W in Step S5. In this case, the efficiency of the replacement with the IPA liquid supplied to the upper surface of the wafer W can be increased. Thus, the IPA replacement period can be reduced. In this case, the heater 5 may be located at a predetermined intermediate position between the lower position (see FIG. 7A and the like) and the upper position (see FIG. 7F and the like) to heat the wafer W.

The IPA is desirably in a liquid phase for proper replacement with the IPA. Therefore, even if the temperature of the upper surface of the wafer W is kept at a temperature higher than the ordinary temperature during the period after the supply of the IPA liquid in Step S4 before the start of the heating of the wafer W in Step S5, it is desirable that the temperature of the upper surface of the wafer W is lower than the boiling point (82.4° C.) of the IPA liquid. During this period, however, the temperature of the upper surface of the wafer W may be increased to not lower than the boiling point of the IPA liquid. Particularly, immediately after the start of the supply of the IPA liquid, the replacement with the IPA on the upper surface of the wafer W does not sufficiently proceed, so that the IPA liquid and the DIW are mixed together on the upper surface of the wafer W. Even if the temperature of the upper surface of the wafer W reaches the boiling point of the IPA liquid in this state, the IPA liquid does not boil. Therefore, the DIW can be properly replaced with the IPA liquid.

In the first embodiment, the heater 5 may be located at the upper position (see FIG. 7F) or at the intermediate position described above to heat the wafer W in the etching step (Step S2 shown in FIG. 6). If the temperature control to be performed in the IPA liquid supplying step (Step S4) is influenced by the heating of the wafer W in the etching step, however, it is desirable not to heat the wafer W.

In the first embodiment, the heater 5 is located at the lower position (see FIG. 7A and the like) in the rinsing step (Step S3 in FIG. 6), so that the wafer W is not heated with a great amount of heat. Alternatively, the heater 5 may be located at the upper position (see FIG. 7F and the like) to heat the wafer W in the rinsing step. In this case, the heater 5 is supposedly moved to the lower position in the IPA liquid supplying step to be performed after the rinsing step in order to increase the efficiency of the replacement with the IPA. If the temperature control to be performed in the IPA liquid supplying step (Step S4) or the like is influenced by the heating of the wafer W in the rinsing step, however, it is desirable not to heat the wafer W.

In the first embodiment, the rinse liquid nozzle 7 is used to spout the rinse liquid by way of example. Alternatively, a rinse liquid flow pipe 802 vertically extending through the center portion of the outer lid 41 as indicated by a broken line in FIG. 1 may be used. The rinse liquid flow pipe 802 has a lower end which opens in the center portion lower surface 45 of the outer lid 41 to serve as a rinse liquid outlet port 803. In this case, the rinse liquid flow pipe 802 is connected to a rinse liquid supply pipe 800 to which the DIW is supplied from the rinse liquid supply source. A rinse liquid valve 801 which opens and closes the rinse liquid supply pipe 800 is provided in the rinse liquid supply pipe 800.

In the first embodiment, the heater 5 is moved up and down to control the distance between the heater 5 and the wafer W by way of example. Alternatively, the distance between the heater 5 and the wafer W may be controlled by moving up and down the substrate holding/rotating mechanism 4 which holds the wafer W or by moving up and down both the heater 5 and the substrate holding/rotating mechanism 4.

A heater rotating unit may be provided, which rotates the heater 5 in synchronism with the rotation of the wafer W.

Where the wafer W is rotated neither in the wafer heating step (S5) nor in the IPA removing step (S6), the IPA liquid film 80 may be formed as having a thickness of about 1 to about 5 mm at a vertically center position of the wafer W.

The supply of the IPA liquid may be stopped at proper timing. For example, the supply of the IPA liquid may be stopped immediately before the start of the wafer heating step (S5), or after a lapse of a predetermined period from the start of the wafer heating step (S5). As described above, the IPA liquid may be additionally supplied to the liquid film 80 in the wafer heating step (S5).

Examples of the organic solvent having a smaller surface tension include methanol, ethanol, acetone and HFE (hydrofluoroether) in addition to the IPA liquid.

The DIW is used as the rinse liquid by way of example. However, the rinse liquid is not limited to the DIW, but other examples of the rinse liquid include carbonated water, electrolytic ion water, ozone water, a hydrochloric acid solution having a dilute concentration (e.g., about 10 to about 100 ppm), and reduced water (hydrogen water).

The nitrogen gas is employed as the inert gas by way of example, but clean air or other inert gas may be used.

In the embodiments described above, the etching process is performed on the wafer W by way of example, but the present invention may be applicable to a cleaning process and other processes. Examples of a cleaning liquid to be used in the cleaning process include SC1 (ammonia/hydrogen peroxide mixture), SC2 (hydrochloric acid/hydrogen peroxide mixture) and buffered HF (hydrofluoric acid/ammonium fluoride mixture) in addition to the dilute hydrofluoric acid solution described above.

In the embodiments described above, the etching process and the cleaning process are performed at an atmospheric pressure, but the ambient pressure for these processes is not limited to the atmospheric pressure. For example, the internal pressure of the enclosed space defined by the lid member 10 and the lower cup 8 may be increased or reduced by means of a predetermined pressure control unit. Thus, the etching process and the cleaning process can be performed in a higher pressure environment having a pressure higher than the atmospheric pressure or in a lower pressure environment having a pressure lower than the atmospheric pressure in the embodiments described above.

While the present invention has been described in detail by way of the embodiments thereof, it should be understood that these embodiments are merely illustrative of the technical principles of the present invention but not limitative of the invention. The scope of the present invention are to be limited only by the appended claims.

This application corresponds to Japanese Patent Application No. 2012-246546 filed in the Japan Patent Office on Nov. 8, 2012 and Japanese Patent Application No. 2013-202711 filed in the Japan Patent Office on Sep. 27, 2013, the disclosure of which is incorporated herein by reference in its entirety.

The invention claimed is:

1. A substrate treatment method comprising:
a rinsing step of supplying a rinse liquid to an upper surface of a substrate formed with a minute pattern, the substrate being horizontally held by a substrate holding unit;
an organic solvent supplying step of supplying an organic solvent having a smaller surface tension than the rinse liquid to the upper surface of the substrate to replace the rinse liquid adhering to the upper surface of the substrate with the organic solvent with a temperature of the upper surface of the substrate being lower than a boiling point of the organic solvent;
a higher temperature maintaining step of maintaining the upper surface of the substrate at a predetermined higher temperature that is higher than the boiling point of the organic solvent to thereby form a gas film of the organic solvent on an entire upper surface of the substrate including a gap of the minute pattern and to form an organic solvent liquid film on the gas film; and
an organic solvent removing step of removing the organic solvent liquid film formed on the gas film, the organic solvent removing step being started after the gas film is formed in the higher temperature maintaining step.

2. The substrate treatment method according to claim 1, wherein the higher temperature maintaining step includes the step of heating a lower surface of the substrate so as to maintain the upper surface of the substrate at the predetermined higher temperature.

3. The substrate treatment method according to claim 2, wherein the higher temperature maintaining step is the step of, while rotating the substrate held by the substrate holding unit, maintaining the upper surface of the substrate at the predetermined higher temperature,
wherein a rotation speed of the substrate in the higher temperature maintaining step is set to 10 rpm to 500 rpm.

4. The substrate treatment method according to claim 1, wherein the higher temperature maintaining step continues until all the organic solvent liquid film is removed from the upper surface of the substrate.

5. The substrate treatment method according to claim 1, wherein the organic solvent removing step removes the organic solvent liquid film from the upper surface of the substrate while maintaining the organic solvent liquid film in a form of liquid mass.

6. The substrate treatment method according to claim 5, wherein the organic solvent removing step includes the step of spouting a gas toward a rotation center of the upper surface of the substrate held by the substrate holding unit while rotating the substrate.

7. The substrate treatment method according to claim 5, wherein the organic solvent removing step includes the step of spraying a gas in a form of zone stream toward the upper surface of the substrate held by the substrate holding unit while moving a gas applying zone on the upper surface of the substrate.

8. The substrate treatment method according to claim 5, wherein the organic solvent removing step includes the step of tilting the substrate held by the substrate holding unit with respect to a horizontal plane.

9. The substrate treatment method according to claim 5, wherein the organic solvent removing step includes the step of heating the substrate held by the substrate holding unit sequentially from a center portion of the substrate toward a peripheral portion of the substrate.

10. The substrate treatment method according to claim 1, wherein the temperature of the upper surface of the substrate in the higher temperature maintaining step is set such that the organic solvent liquid film is prevented from boiling in the higher temperature maintaining step.

11. The substrate treatment method according to claim 1, wherein the predetermined higher temperature is higher by 10° C. to 50° C. than the boiling point of the organic solvent.

12. The substrate treatment method according to claim 1, wherein a substrate temperature in the higher temperature maintaining step is set such that a gas-phase organic solvent contained in the organic solvent gas film is prevented from cleaving through the organic solvent liquid film to above the organic solvent liquid film.

13. The substrate treatment method according to claim 1, wherein a duration of the higher temperature maintaining step is set such that a gas-phase organic solvent contained in the organic solvent gas film is prevented from cleaving through the organic solvent liquid film to above the organic solvent liquid film.

14. The substrate treatment method according to claim 1, wherein a thickness of the organic solvent liquid film in the higher temperature maintaining step is set such that the organic solvent liquid film is prevented from being split in the higher temperature maintaining step.

15. The substrate treatment method according to claim 1, further comprising a spin drying step of rotating the substrate held by the substrate holding unit to dry the substrate after the organic solvent removing step.

* * * * *